(12) United States Patent
Ishihara

(10) Patent No.: US 8,451,647 B2
(45) Date of Patent: May 28, 2013

(54) RESISTANCE CONTROL METHOD FOR NONVOLATILE VARIABLE RESISTIVE ELEMENT

(75) Inventor: Kazuya Ishihara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 187 days.

(21) Appl. No.: 13/157,620

(22) Filed: Jun. 10, 2011

(65) Prior Publication Data
US 2011/0305070 A1    Dec. 15, 2011

(30) Foreign Application Priority Data

Jun. 10, 2010  (JP) ................................ 2010-133016

(51) Int. Cl.
*G11C 11/00* (2006.01)
(52) U.S. Cl.
USPC ........................... 365/148; 365/163; 365/211
(58) Field of Classification Search
USPC ........................................................ 365/100
See application file for complete search history.

(56) References Cited

U.S. PATENT DOCUMENTS

| | | | |
|---|---|---|---|
| 6,204,139 B1 | 3/2001 | Liu et al. | |
| 6,815,744 B1 | 11/2004 | Beck et al. | |
| 7,248,494 B2* | 7/2007 | Oh et al. | 365/148 |
| 8,139,432 B2* | 3/2012 | Choi et al. | 365/211 |
| 2007/0195581 A1 | 8/2007 | Morimoto | |
| 2008/0049487 A1 | 2/2008 | Yoshimura et al. | |
| 2010/0027317 A1 | 2/2010 | Maejima | |
| 2010/0054019 A1 | 3/2010 | Toda | |
| 2010/0232209 A1 | 9/2010 | Kawabata et al. | |

FOREIGN PATENT DOCUMENTS

| | | |
|---|---|---|
| JP | 2002-537627 | 11/2002 |
| JP | 2007-226883 | 9/2007 |
| JP | 2008-052781 | 3/2008 |
| JP | 2008-065953 | 3/2008 |
| JP | 2010-033676 | 2/2010 |
| JP | 2010-055719 | 3/2010 |

OTHER PUBLICATIONS

Dearnaley et al., "Electrical Phenomena in Amorphous Oxide Films", *Rep. Prog. Phys.*, 1970, 33, pp. 1129-1191.

Liu et al., "Electric-pulse-induced reversible Resistance change effect in magneto-resistive films", *Applied Physics Letters*, 2000, vol. 76, p. 2749-2751.

Pagnia et al., "Bistable Switching in Electroformed Metal-Insulator-Metal Devices", *Phys. Stat. Sol.* (a), 1988, vol. 108, p. 11-65.

(Continued)

*Primary Examiner* — Tan T. Nguyen
(74) *Attorney, Agent, or Firm* — Nixon & Vanderhye, P.C.

(57) ABSTRACT

A resistance control method for a nonvolatile variable resistive element in a nonvolatile semiconductor memory device is provided. The device includes a memory cell array in which unit memory cells having nonvolatile variable resistive elements and transistors are arranged in a matrix. The memory cells that are targets of a memory operation are selected by first selection lines (word lines), second selection lines (bit lines) and third selection lines (source lines). The method includes steps of selecting one or more first selection lines, selecting a plurality of second selection lines, and applying a compensated voltage in which a change in potential of the third selection lines caused by current flowing into the third selection lines through the second selection lines is compensated in a voltage that is necessary for the memory operation, such that the voltage necessary for the memory operation is applied to all of the selected memory cells.

6 Claims, 14 Drawing Sheets

OTHER PUBLICATIONS

Baek et al., "Highly scalable non-volatile resistive memory using simple binary oxide driven by asymmetric unipolar voltage pulses", *IEDM Technical Digest*, 2004, p. 587-590.

Tamai et al., "RRAM Technology for Fast and Low-Power Forming/Switching", *International Conference on SSDM*, 2008, pp. 1166.

* cited by examiner

RESISTANCE CONTROL METHOD FOR NONVOLATILE VARIABLE RESISTIVE ELEMENT

CROSS REFERENCE TO RELATED APPLICATION

This Nonprovisional application claims priority under 35 U.S.C. §119(a) on Patent Application No. 2010-133016 filed in Japan on 10 Jun., 2010 the entire contents of which are hereby incorporated by reference.

BACKGROUND OF THE INVENTION

1. Field of the Invention

The present invention relates to a resistance control method for a nonvolatile variable resistive element in a nonvolatile semiconductor memory device that stores information using the nonvolatile variable resistive element, the resistance control method being for collectively performing one of memory operations of a programming process, an erasure process, and the forming process on a plurality of the elements.

2. Description of the Related Art

In recent years, various device structures, such as FeRAMs (ferroelectric RAMs), MRAMs (magnetic RAMs) and OUMs (ovonic unified memories) have been proposed as next-generation nonvolatile random access memories (NVRAMs) which make high speed operation possible and substitute flash memories, and the competition is severe in the development of memories having higher performance, higher reliability, lower cost and process compatibility. However, these memory devices currently have both good and bad points, and we are far away from realizing an ideal "universal memory" having all the good points of SRAMs, DRAMs and flash memories.

In addition to these existing technologies, resistive random access memories (RRAM) using nonvolatile variable resistive elements having an electrical resistance that changes reversibly when a voltage pulse is applied have been proposed. The structure of these nonvolatile variable resistive elements is extremely simple and, as shown in FIG. 1, the nonvolatile variable resistive element 100 has a structure where a lower electrode 106, a variable resistor 104 and an upper electrode 102 are layered in sequence from the bottom, so that the resistive value changes reversibly when electrical stress, for example a voltage pulse, is applied across the upper electrode 102 and the lower electrode 106. A novel nonvolatile memory device that reads out the resistive value during the operation for reversibly changing the resistance (hereinafter referred to as "switching operation") can thus be implemented.

As for the material for the variable resistor 104, there is research by Shangquing Liu and Alex Ignatiev, among others, from Houston University, US, and U.S. Pat. No. 6,204,139 and Liu, S. Q. et al. "Electric-pulse-induced reversible Resistance change effect in magneto-resistive films", Applied Physics Letters, 2000, Vol. 76, p. 2749-2751 disclose a method for reversibly changing the electrical resistance by applying a voltage pulse to a Perovskite material, which is known to have colossal magneto-resistance effects. Here, in the element structure shown as an example in U.S. Pat. No. 6,204,139, a crystalline praseodymium calcium manganese oxide $Pr_{1-x}Ca_xMnO_3$ (PCMO) film, which is a Perovskite oxide, is used as the material for the variable resistor 104.

In addition, it is known from H. Pagnia et al. "Bistable Switching in Electroformed Metal-Insulator-Metal Devices", Phys. Stat. Sol. (a), 1988, vol. 108, p. 11-65 and Japanese Translation of International Patent Publication 2002-537627 that titanium oxide ($TiO_2$) films, nickel oxide (NiO) films, Zinc oxide (ZnO) films and niobium oxide ($Nb_2O_5$) films, which are oxides of transition metals, also exhibit reversible change in the resistance. When such transition metal oxides as titanium oxide and nickel oxide are used as variable resistors, a localized region where the resistivity is low (hereinafter referred to as "filament path") is created or decomposes in the oxide when the temperature rises, due to a current flowing into the nonvolatile variable resistive element, and this is believed to cause the resistance to change. The electrical properties of such filament paths are disclosed in G. Dearnaley et al. "Electrical phenomena in amorphous oxide films", Rep. Prog. Phys., 1970, Vol. 33, p. 1129-1191.

That is to say, nonvolatile variable resistive elements are initially in an isolated state after manufacture, and in order to convert them to a state in which they can be switched between a high resistance state and a low resistance state using electrical stress, it is necessary to form a filament path within the nonvolatile variable resistive element by applying a voltage, as shown in I. G. Baek et al., "Highly scalable non-volatile resistive memory using simple binary oxide driven by asymmetric unipolar voltage pulses", IEDM Technical Digest, 2004, p. 587-590. This process for forming a filament path within a nonvolatile variable resistive element is referred to as a forming process.

FIG. 2 shows the relationship between the level of the voltage pulse applied in the forming process and the thickness of the oxide (cobalt oxide) layer during the time required for a filament path to be formed, so that the forming process can be completed (hereinafter referred to as "forming time"), as shown in Y. Tamai et al. "RRAM Technology for Fast and Low-Power Forming/Switching", International Conference on Solid State Devices and Materials (SSDM), 2008, p. 1166. The higher the level of the applied voltage is and the thinner the oxide layer is, the shorter the forming time tends to be, and in the case where a forming voltage of 3 V is applied, the forming process completes in 1 µs for an oxide layer of 10 nm, while the forming process completes in 100 µs for 50 nm. Meanwhile, it is necessary to apply a voltage of as high as 20 V to oxide layers of 50 nm in order for the forming process to complete in 1 µs, and application of approximately 3 V is necessary for oxide layers of 10 nm.

Here, the forming time is the cumulative time over which a pulse is applied in the case where a voltage pulse is applied a number of times during the forming process.

As shown in FIG. 2, the forming time depends on the film thickness of the metal oxide for the variable resistor, and the nonvolatile variable resistive elements have different thicknesses, and therefore, there is inconsistency in the forming time between the elements. Therefore, a forming process, which is efficient for converting nonvolatile variable resistive elements to a state in which a switching operation is possible needs to be carried out on each individual element by adjusting the voltage.

However, at the stage of fabrication of memories having a practical size using memory cells with nonvolatile variable resistive elements, it takes too much time to carry out a forming process on each memory cell of the memory, and therefore, it is urgent to shorten the forming time, from the point of view of efficiency in mass production. Concretely, in the case where a forming process is carried out on a memory of 128 Mbytes, 1 µs is necessary for the forming process on one memory cell (1 bit) with an applied voltage of 3 V in the case where the oxide film layer is 10 nm according to the value in Y. Tamai et al. "RRAM Technology for Fast and Low-Power Forming/Switching", International Conference on Solid State Devices and Materials (SSDM), 2008, p. 1166, and therefore, at least 15 minutes are required to carry out the forming process on each memory cell.

Here, though it is possible to increase the efficiency of the forming process so that the total forming time is shorter when a forming process is simultaneously carried out on a number of memory cells, it is necessary to solve the below described problems in order to do so.

FIG. 3 is an equivalent circuit diagram showing a memory cell array using nonvolatile variable resistive elements, and FIG. 4 shows an equivalent circuit of a unit memory cell. One terminal of a nonvolatile variable resistive element having two terminals is connected to the drain terminal of a selection transistor, and the other is connected to a second selection line (bit line; BL). The gate terminal of the selection transistor is connected to a first selection line (word line; WL) and the source terminal is connected to a third selection line (source line; SL).

In the memory cell array in FIG. 3, where the same memory cells as in FIG. 4 are aligned in a matrix, a voltage is applied through the first selection line WL1, so that the selection transistors are converted to an ON state, and a voltage pulse for a forming process is simultaneously applied to the second selection lines BL1 to BL16, so that a forming process is attempted to be carried out simultaneously on a number of nonvolatile variable resistive elements VR11 to VR1g of the memory cells that are connected to the first selection line WL1.

The time for the forming process is inconsistent between the nonvolatile resistive elements, and therefore, the first memory cell completes the forming process first. Here, it is assumed that the forming of the nonvolatile variable resistive element VR12 that is connected to the second selection line BL2 is completed first. The resistance lowers in the memory cell where the forming process is complete, and therefore, the current that flows through the second selection line BL2 increases due to the completion of the forming process on VR12, and the potential of the third selection line SL1 increases. Thus, the voltage required for the forming process stops being supplied to the other memory cells that are connected to the third selection line SL1, of which the potential has increased.

As a result, the forming time prolongs, or the forming process makes no longer progresses.

SUMMARY OF THE INVENTION

The present invention has been completed in view of the aforementioned problem regarding the forming process of the memory cell array that stores information using the nonvolatile variable resistive element with a two-terminal structure, and a first object herein is to provide a resistance control method for a nonvolatile variable resistive element, the method being capable of simultaneously performing the forming process on a plurality of memory cells.

Further, the present invention has a second object of providing a resistance control method for a nonvolatile variable resistive element, the method being capable of simultaneously performing a programming operation and an erasure operation on a plurality of memory cells.

The resistance control method for a nonvolatile variable resistive element of the present invention for achieving the above objects includes a first feature as follows. In a nonvolatile semiconductor memory device including a memory cell array in which a plurality of memory cells is arranged in row and column directions in a matrix, each memory cell being formed by connecting one terminal of the nonvolatile variable resistive element having two terminals in which electrodes are provided at both ends of a variable resistor, to one of other two terminals of a selection element, which has three terminals including a control terminal and the other two terminals that are other than the control terminal, the control terminal being for controlling an amount of current flowing across the other two terminals by current or voltage applied to the control terminal, the nonvolatile variable resistive element is subjected to a forming process, so that its resistive state transitions between two or more different resistive states by applying an electrical stress across the both terminals of the nonvolatile variable resistive element, and one resistive state after the transition is used for storing information, the each memory cell is configured such that the control terminal of the selection element is connected to a first selection line, and one of a terminal of the nonvolatile variable resistive element that is not connected to the selection element and a terminal of the selection element that is other than the control terminal and not connected to the nonvolatile variable resistive element is connected to a second selection line and the other thereof is connected to a third selection line, the first selection line extends in the row direction and connects the memory cells belonging to the same row, the second selection line extends in the column direction and connects the memory cells belonging to the same column, and the memory cells in the memory array are mutually connected by the first selection line, the second selection line and the third selection line, the method comprises, when one or more first selection lines and a plurality of second selection lines are to be selected, respectively and one of memory operations of a programming process, an erasure process, and the forming process is to be collectively performed on target memory cells that are all of the memory cells selected by the first selection lines and the second selection lines, a first step of selecting the one or more of the first selection lines connected to the target memory cells that are targets of the memory operation in the memory array and applying a predetermined selection voltage to all of the selected first selection lines; a second step of selecting the plurality of second selection lines connected to the target memory cells in the memory array; and a third step of applying, to each of the selected second selection lines, a compensated voltage in which a change in potential of the third selection lines caused by current flowing into the third selection lines through the second selection lines is compensated in a voltage that is necessary for the memory operation of the nonvolatile variable resistive elements, the change in potential being dependent on a maximum number of the target memory cells that are commonly connected to each of the third selection lines to which the respective target memory cells on the selected second selection line are connected, such that the voltage that is necessary for the memory operation is applied to both terminals of all of the target memory cells.

According to the resistance control method for a nonvolatile variable resistive element having the above first feature, in the nonvolatile semiconductor memory device having the memory cell array in which a plurality of memory cells is arranged in the row and column directions in a matrix, each unit memory cell including the nonvolatile variable resistive element having two terminals and the selection element having the three terminals such as a transistor, by having the step of predeterminedly applying, to the second selection lines (bit lines), the voltage to which an increase in the potential of the third selection lines (source lines) caused by the current flowing into the third selection lines during the memory operation is added, the voltage necessary for the memory operation can be supplied to all of the plurality of memory cells that is selected by the plurality of second selection lines and the one or more first selection lines (word lines), and the memory operation can be performed simultaneously on the plurality of memory cells.

Further, in addition to the above first feature, the resistance control method for a nonvolatile variable resistive element of the present invention has a second feature that, in the memory cell array, each of the third selection lines extends in the column direction, and the memory cells belonging to the same column are mutually connected by each of the third selection lines.

According to the resistance control method for a nonvolatile variable resistive element of the above second feature, by adapting the present invention to the nonvolatile semiconductor memory device in which the second selection lines and the third selection lines are extended in parallel, the number of the memory cells commonly connected to the third selection lines can be suppressed to the number of the first selection lines (word lines), and the increase in the potential of the third selection lines caused by the current flowing into the third selection lines through the selected memory cells can be reduced.

Further, in addition to the above first or second features, the resistance control method for a nonvolatile variable resistive element of the present invention has a third feature that the memory operation is the forming process.

Further, in addition to the above third feature, the resistance control method for a nonvolatile variable resistive element of the present invention has a fourth feature that, in the forming process, a bias condition for the selection elements in the memory cells is set such that the amount of current that flows in the nonvolatile variable resistive elements is equal to or lower than 50 µA.

According to the resistance control method for a nonvolatile variable resistive element of the above fourth feature, the amount of current flowing into the third selection lines is restricted by using the selection transistors, and the increase in the potential of the third selection lines can be suppressed to be within a certain allowable range.

Especially in the forming process, since lowering of the resistance of the nonvolatile variable resistive elements accompanies the completion of the forming process, the amount of current flowing into the third selection lines through the elements with the lowering of the resistance is increased, and the potential of the third selection lines is increased. At this occasion, the amount of current flowing into the third selection lines accompanying the completion of the forming process can be restricted to be equal to or less than a predetermined value by setting the bias condition of the selection elements such that the amount of current that flows in the nonvolatile variable resistive elements of the memory cells is equal to or lower than the predetermined value (e.g. 50 µA).

Further, in addition to the above third or fourth features, the resistance control method for a nonvolatile variable resistive element of the present invention has a fifth feature that the nonvolatile semiconductor memory device is formed by connecting a forming detection circuit to the second selection line directly or via a decoder, or to the third selection line directly or via a decoder in a case where the third selection lines extend in the column direction, the forming detection circuit being for detecting, upon completion of the forming process, a change in current flowing through predetermined position in the second selection line or a change in potential at the predetermined position of the second selection line, and the method further comprising a fourth step in which, when the forming detection circuit detects the change in current or potential in a particular second selection line, the nonvolatile semiconductor memory device stops application of the voltage through the particular second selection line in a case where the forming process of all of the memory cells connected to the particular second selection line is completed.

Further, in addition to the above fifth feature, the resistance control method for a nonvolatile variable resistive element of the present invention has a sixth feature that, when the nonvolatile semiconductor memory device stops the application of the voltage through the particular second selection line in the fourth step, the method further comprising a fifth step of setting the particular second selection line as unselected, recalculating the maximum number of the target memory cells to be subjected to the forming process that are commonly connected to each of the third selection lines to which the respective target memory cells on the respective selected second selection lines are connected, and applying, to each of the selected second selection lines, a compensated voltage in which a change in potential of the third selection lines caused by current flowing into the third selection lines through the second selection lines is compensated in a voltage that is necessary for the forming process of the nonvolatile variable resistive elements.

According to the present invention, a resistance control method for a nonvolatile variable resistive element in which a programming operation, an erasure operation and a forming process can be performed on a plurality of memory cells that is selected by one or more first selection lines (word lines) and a plurality of second selection lines (bit lines) by simultaneously applying a voltage pulse is provided. Due to this, a forming time can be shortened. Furthermore, a time required for the programming and erasure operations is shortened, and a high-speed operation becomes possible.

DETAILED DESCRIPTION OF THE INVENTION

Hereinbelow, a resistance control method for a nonvolatile variable resistive element of the present invention (hereinbelow referred to as "the method of the present invention") will be explained with reference to the drawings.

First Embodiment

Figure 5:
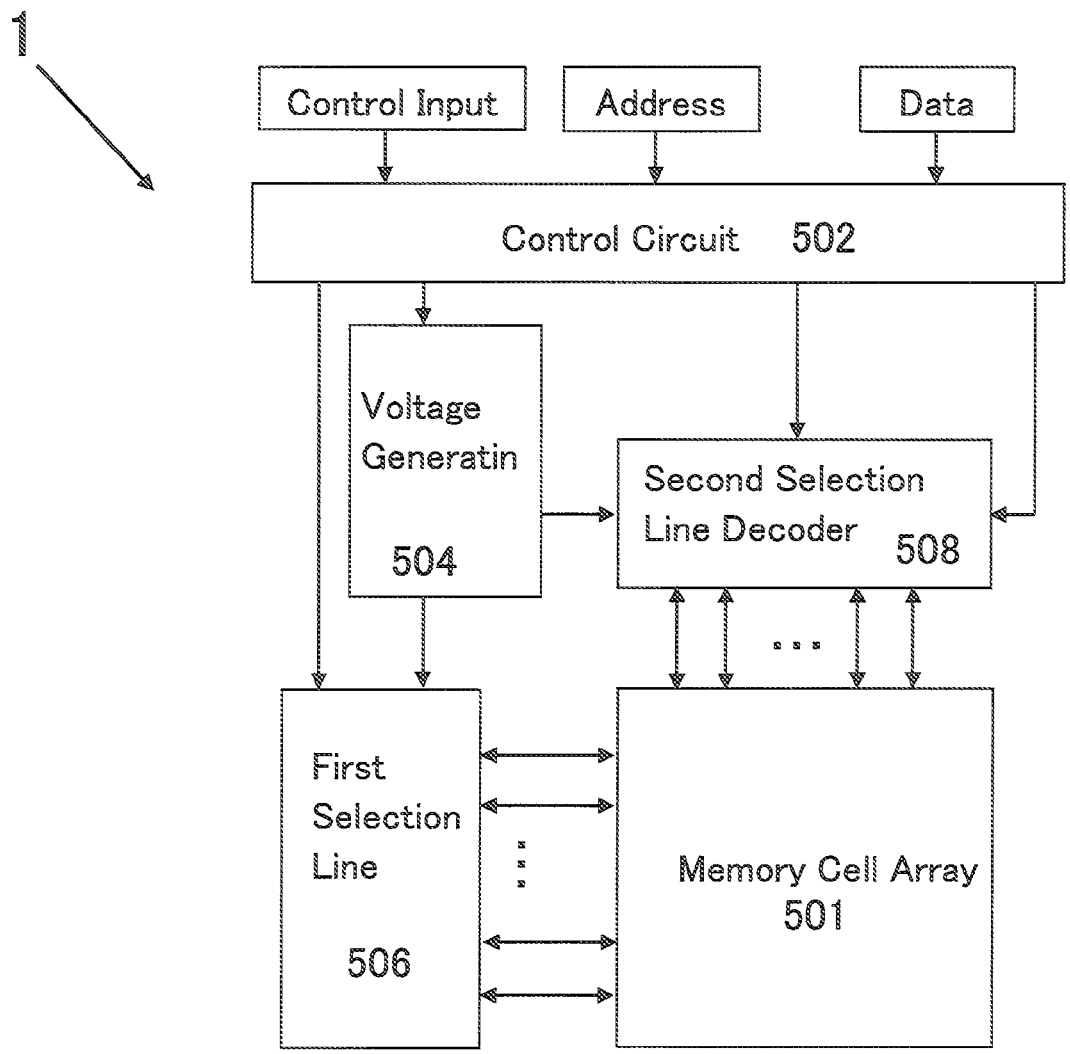
FIG. 5 is a structural block diagram of a nonvolatile semiconductor memory device that can use a method of the present invention.

FIG. 5 is a structural circuit diagram of a nonvolatile semiconductor memory device (hereinbelow referred to as "the device 1 of the present invention") that is an object of adaptation of the method of the present invention. As shown in FIG. 5, the device 1 of the present invention is formed by including a memory cell array 501 (501a or 501b, 501a in this embodiment), a control circuit 502, a voltage generating circuit 504, a first selection line decoder 506, and a second selection line decoder 508.

Figure 1:
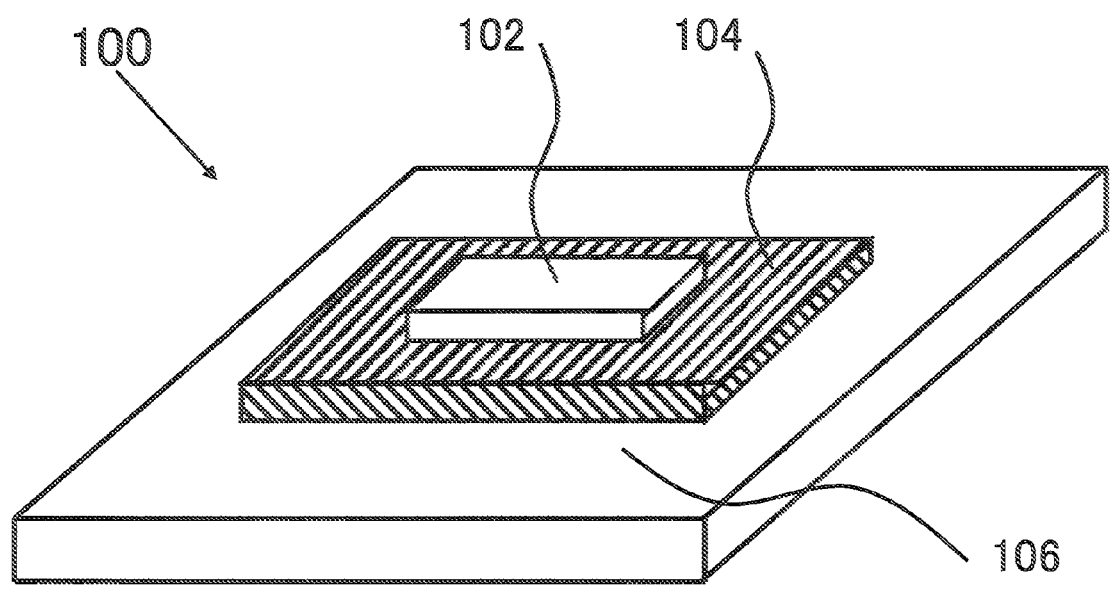
FIG. 1 is a diagram showing the structure of a nonvolatile variable resistive element.
Figure 2:
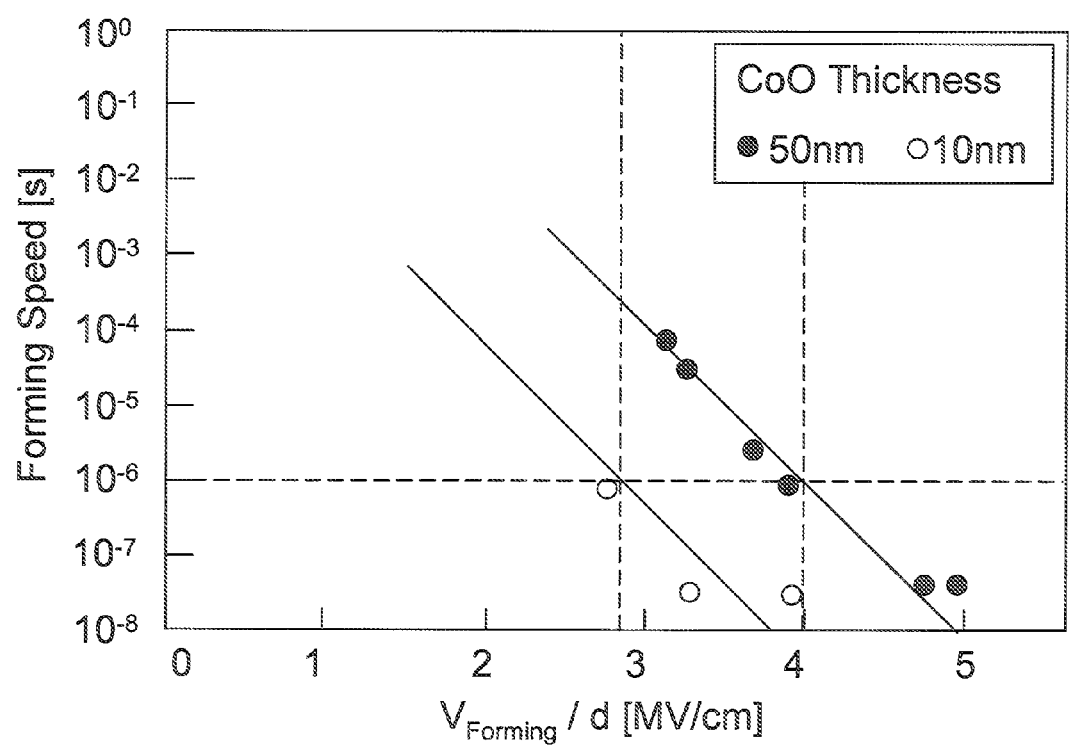
FIG. 2 is a graph showing the relationship between the time required for the forming process and the voltage applied in a forming process and the film thickness of the variable resistor.
Figure 3:
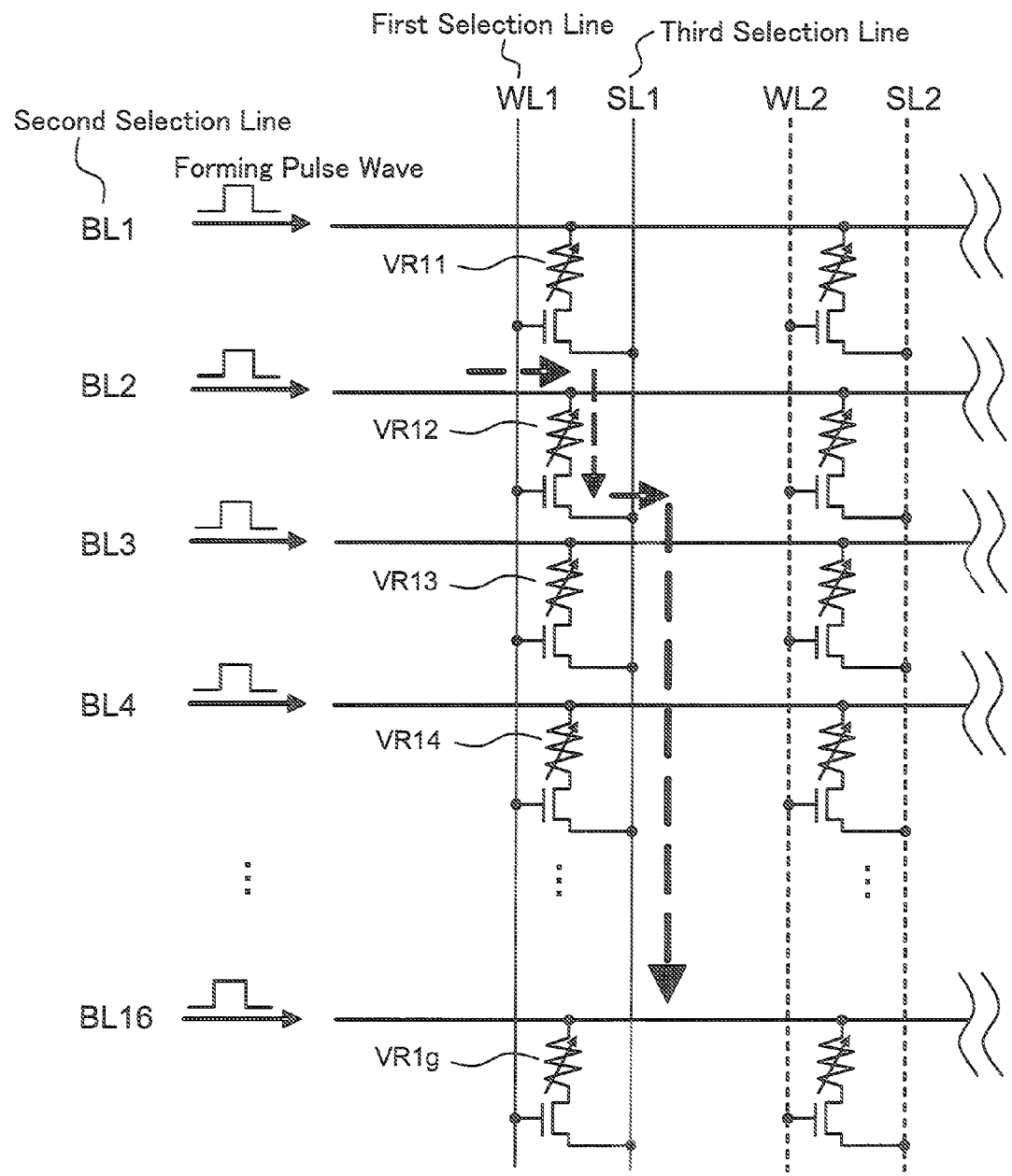
FIG. 3 is an equivalent circuit diagram showing a memory cell array using nonvolatile variable resistive elements, as well as problems with conventional control methods for a forming process.
Figure 4:
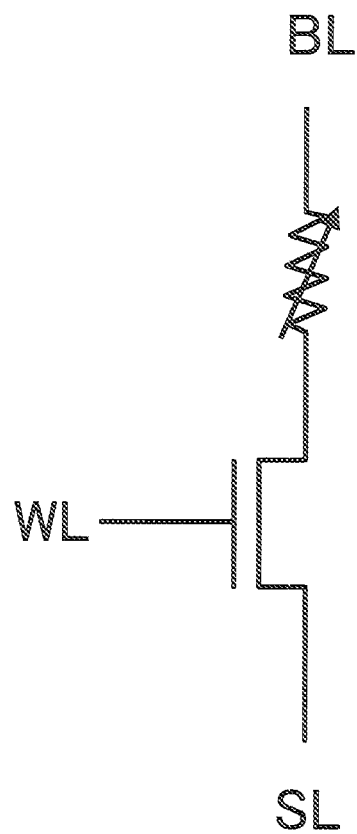
FIG. 4 is an equivalent circuit diagram showing a memory cell using a nonvolatile variable resistive element.

The memory cell array 501a is shown in the equivalent circuit diagram of FIG. 3, and has memory cells including a nonvolatile variable resistive element and a selection transistor that are aligned in a matrix. Here, the nonvolatile variable resistive elements are nonvolatile variable resistive elements with two terminals having electrodes at both ends of a variable resistor, and electrical stress is applied across the two terminals of the nonvolatile variable resistive elements when a forming process is carried out, so that the variable resistive elements can transit between two or more different resistance states, and thus one resistance state after transition can be used for storing information. The selection transistors are MOS transistors, for example, and one terminal of a nonvolatile variable resistive element and the drain terminal of a selection transistor are connected so as to form a memory cell. The gate terminals of the selection transistors are connected to first selection lines (word lines) that extend in the direction of rows (the vertical direction in FIG. 3), so that memory cells in the same row are connected to each other by means of the first selection lines. The other terminal of the nonvolatile variable resistive element that is not connected to the selection transistor is connected to a second selection line (bit line) that extends in the direction of columns (the lateral direction in FIG. 3), so that memory cells in the same column are connected to each other by means of the second selection lines. The source terminals of the selection transistors are connected to the third selection lines (source lines) which extend in the direction of rows, so that memory cells in the same row are connected to each other by means of the third selection lines. Either a first selection voltage or a first non-selection voltage is applied through a first selection line, and either a second selection voltage or a second non-selection voltage is applied through a second selection line, so that one memory cell that is designated through an address input from the outside can be selected for the respective operations of the programming, erasure, read-out and forming processes. Here, though in the present embodiment, the third selection lines are grounded during the respective operations, a minuscule bias voltage that is slightly higher than the ground voltage may be applied.

Here, oxides of a transition metal, such as Ti, Fe, Co, Ni, Zr, Nb, Hf or Ta, are possible as the material for the variable resistors used in the above described memory cell array 501a, and Al, Ti, Cu, Ag, Ta, W, Pt and TiN are possible as the material for the electrodes. In the above described memory cell array 501a, for example, the material for the variable resistors is cobalt oxide, both electrodes of the nonvolatile variable resistive elements are formed of an electrode material TiN, and the device structure, including selection transistors, is appropriately designed so that elements having a size of approximately 0.4 µmϕ can be fabricated in accordance with well-known, standard manufacturing process technologies. Concrete descriptions for the device structure and manufacturing method are omitted.

The control circuit 502 controls the memory operation, including programming, erasure and read-out, of the memory cell array 501a, and also controls the forming process. Concretely, the control circuit 502 controls the first selection line decoder 506 and the second selection line decoder 508 on the basis of an address signal inputted from an address line, a data input inputted from a data line and a control input signal inputted from a control signal line, so that the respective memory operations and forming process for the memory cells can be controlled. Concretely, this is a circuit having the function of an address buffer circuit, a data input/output buffer circuit and a control input buffer circuit.

The voltage generating circuit 504 generates application voltage necessary for the respective memory operations of programming, erasure, read-out, and forming processes and provides the same to the first selection line decoder 506 and the second selection line decoder 508. In the forming process of the memory cells, the voltage generating circuit 504 generates a first selection voltage necessary for selecting memory cells that are the targets of the forming process and a first non-selection voltage that unselects memory cells that are not the targets of the forming process, and provides the same to the first selection line decoder. Further, it generates a voltage pulse for the forming process for the memory cells selected as the targets of the forming process, and provides the same to the second selection line decoder 508. Especially in the method of the present invention, the voltage generating circuit 504 adjusts a voltage amplitude value of the voltage pulse to a value in which an increase in the potential of the third selection lines is compensated based on positions and numbers of the selected first selection lines and the selected second selection lines, according to the maximum number of memory cells that are the targets of the forming and commonly connected to each of the third selection lines to which the respective selected memory cells on the selected second selection lines are connected, and applies the voltage pulse whose voltage amplitude value has been adjusted to the second selection line decoder 508.

When an address signal is inputted into an address line to designate a memory cell for which a forming process is to be carried out, the first selection line decoder (word line decoder) 506 selects a first selection line corresponding to the address signal inputted into the address line, and applies the first selection voltage and the first non-selection voltage to the selected first selection line and unselected first selection lines, respectively during the forming operation for the memory cell array 501a. Concretely, a voltage is applied to the selected first selection line, so that only the selection transistors connected to the selected first selection line are converted to an ON state. In addition, the first selection line decoder 506 is also used to select a first selection line corresponding to the respective memory operations of the programming, erasure and read-out processes during each operation.

When an address signal is inputted into the address line to designate the memory cell for which the forming process is to be carried out, the second selection line decoder (bit line decoder) 508 selects the second selection line corresponding to the address signal for column selection that is inputted into the address line, and applies a voltage pulse for a forming process through the selected second selection line during the forming operation of the memory cell array 501*a*. In addition, the second selection line decoder 508 is also used to select a second selection line corresponding to the respective memory operations of the programming, erasure and read-out processes during each operation.

Figure 6:
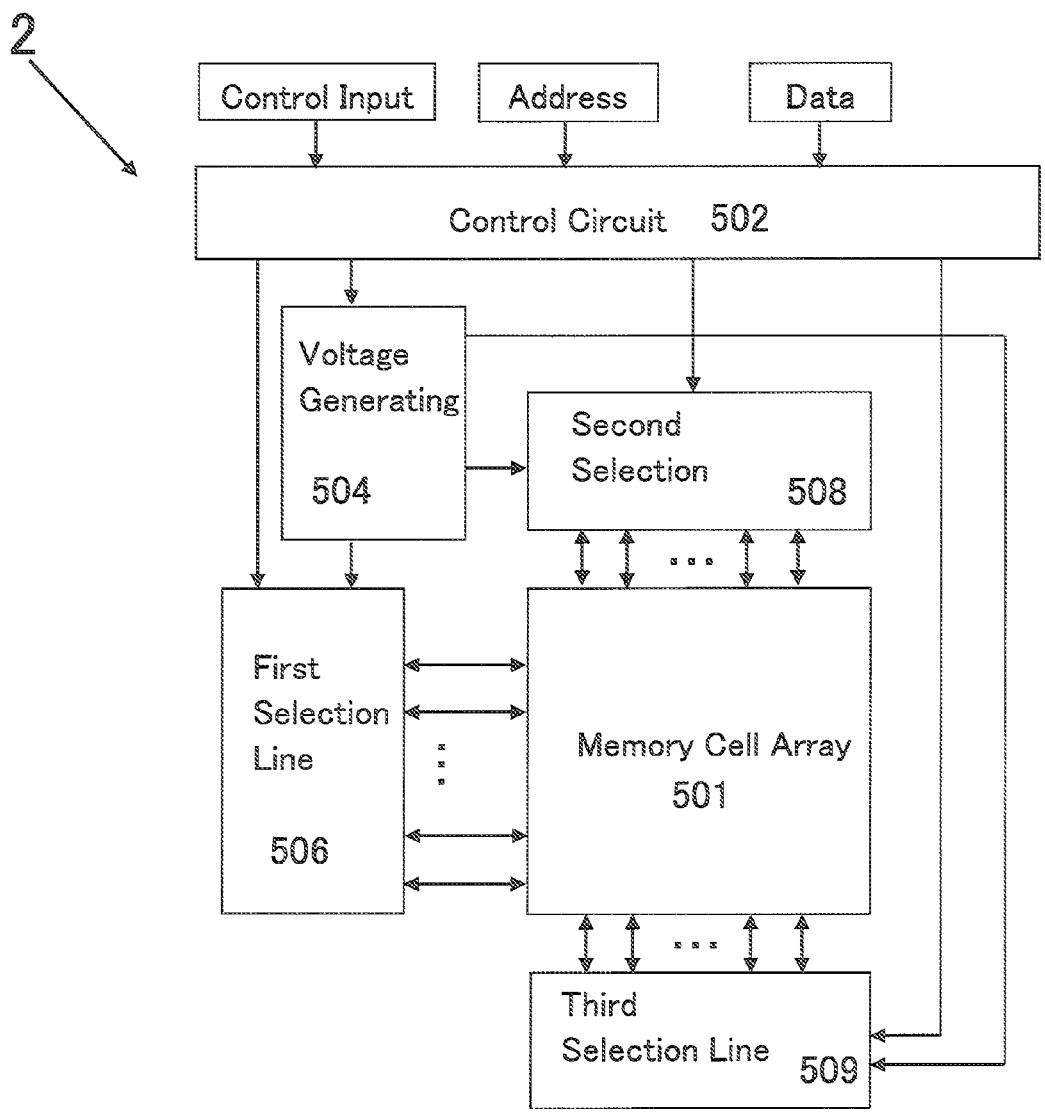
FIG. 6 is a structural block diagram of a nonvolatile semiconductor memory device that can use the method of the present invention.

Further, the device 1 of the present invention may be formed by further including a decoder for selecting the third selection lines corresponding to the respective memory operations of the programming, erasure, read-out and forming processes during each operation. A nonvolatile semiconductor memory device shown in FIG. 6 (hereinbelow referred to as "the device 2 of the present invention") includes a third selection line decoder 509, by which one of the first selection voltage and the first non-selection voltage via the first selection lines, one of the second selection voltage and the second non-selection voltage via the second selection lines, and one of the third selection voltage and the third non-selection voltage via the third selection lines can be independently applied, and at the time of the respective memory operations, one memory cell that is the target of the operation as designated by an address input from outside can be selected. In this configuration, based on an address signal inputted from an address line, data input inputted from a data line and a control input signal inputted from a control signal line, the control circuit 502 controls the first selection line decoder 506, the second selection line decoder 508 and the third selection line decoder 509, so that the respective memory operations for the memory cells can be controlled. The voltage generating circuit 504 generates application voltage that is necessary for the respective memory operations and provides the same to the first selection line decoder 506, the second selection line decoder 508 and the third selection line decoder 509.

Figure 7:
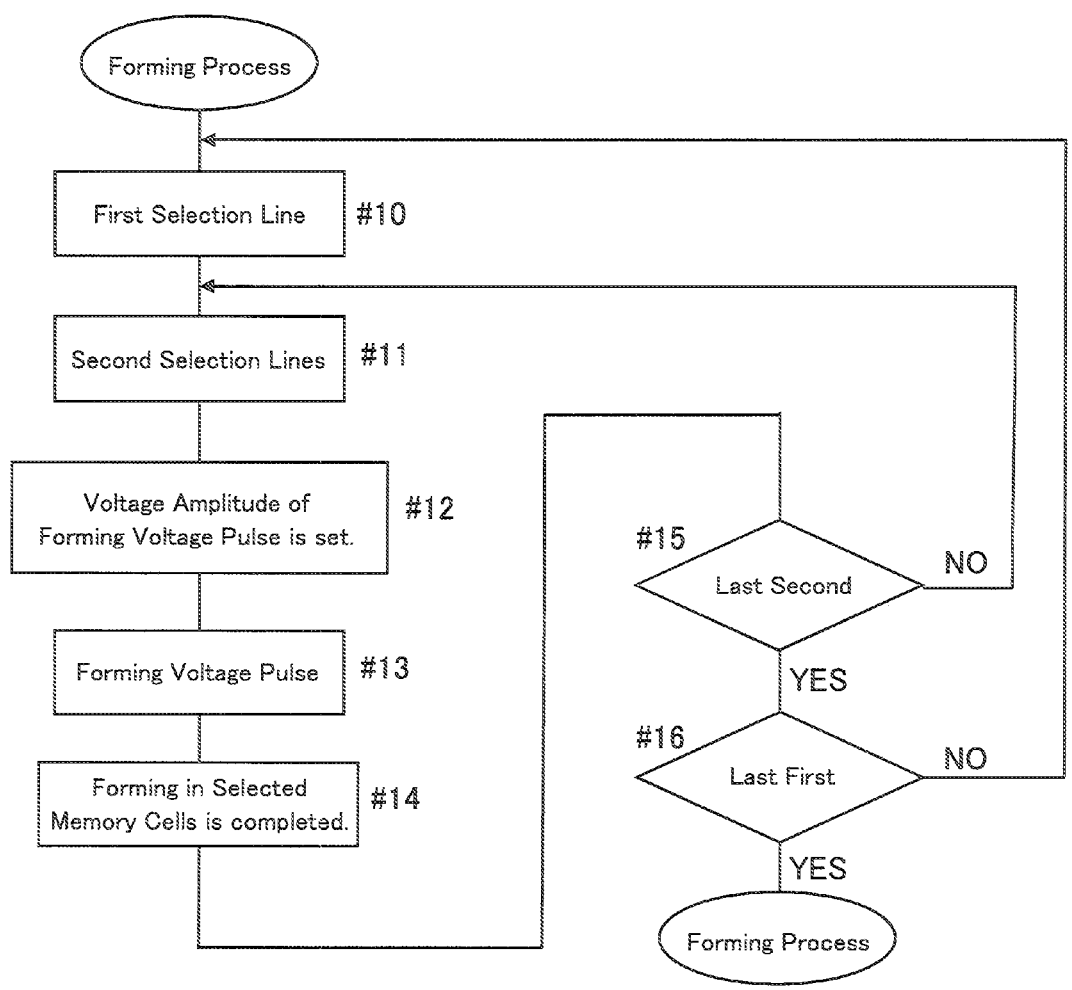
FIG. 7 shows a flowchart of a control method of the forming process of the present invention.

Hereinbelow, an operation of a case of collectively performing the forming process to a plurality of memory cells according to the method of the present invention in order to perform the forming process on all of the memory cells in the memory array will be explained with reference to FIG. 3 and FIG. 7. FIG. 7 is a flowchart showing the control of the forming process of the method of the present invention.

First, the first selection line (word line) is selected (step #10). Here, the first selection line WL1 is selected. The voltage generating circuit 504 generates the first selection voltage and the first non-selection voltage, and the first selection line decoder 506 respectively applies the first selection voltage to the gate terminals of the selection transistors of the memory cells connected to the selected first selection line, and the first non-selection voltage to the gate terminals of the selection transistors of the memory cells connected to the unselected first selection lines. Due to this, current can be caused to flow only in the nonvolatile variable resistive elements of the memory cells connected to the selected first selection line.

Next, a plurality of second selection lines (bit lines) are selected (step #11). Here, all of the second selection lines BL1 to BL16 in the memory cell array are selected.

When the first selection line and the second selection lines are respectively selected, for each of the selected second selection lines, the maximum number of memory cells that are the targets of the forming and commonly connected to each of the third selection lines to which the respective selected memory cells on the selected second selection line are connected is calculated based on the positions and the numbers of the selected first selection line and second selection lines, and an absolute value $V_{BLF}$ of the voltage amplitude of the forming voltage pulse to be applied is set such that a formula 2 described later is satisfied (step #12). In the memory cell array 501*a* of the present embodiment, since the second selection lines and the third selection lines orthogonally intersect, the maximum number of the memory cells commonly connected to the third selection lines for each of the selected second selection lines is equal to the total number of the selected second selection lines. Here, since all of the second selection lines BL1 to BL16 are being selected, the maximum number of the memory cells is 16.

The voltage generating circuit 504 generates the voltage pulse for the forming process with the voltage amplitude calculated in the above step #12, and the second selection line decoder 508 simultaneously applies the voltage pulse for the forming process via all of the selected second selection lines, and causes the current to flow from the selected second selection lines to the third selection lines (source lines) (step #13). Due to this, the forming process is simultaneously performed on the plurality of memory cells VR11 to VR1*f* that is selected by the first selection line WL1 and the second selection lines BL1 to BL16.

When the forming process is completed in one of the memory cells among the memory cells VR11 to VR1*g* selected by the first selection line WL1 and the second selection lines BL1 to BL16, the resistance of the nonvolatile variable resistive element in this memory cell is decreased, whereby the amount of current flowing into the second selection line to which this memory cell connects is increased, and the current with the amount of current added thereto flows into the third selection line SL1. As a result, in a case where a voltage pulse with a positive (negative) polarity is applied to the selected second selection line, the potential of the third selection line increases (decreases) due to the influence of the parasitic resistance, etc. of the third selection line. At the same time, due to the influence of load circuits such as the transistors, etc. existing in the voltage pulse applying path, such as the second selection line decoder 508, etc., the potential of the second selection line connected to the memory cell where the forming process has been completed decreases (increases). As a result, the absolute value of the substantial voltage pulse that is applied to the nonvolatile variable resistive element is lowered.

Here, assuming that the current that flows into the third selection line SL1 upon the completion of the forming of one memory cell is $I_{SL}$, and the maximum value of the parasitic resistance from the connecting point of the third selection line and the memory cell to the ground potential is RL1, at the time when the forming process of n memory cells among N selected memory cells commonly connected to the third selection line SL1 is completed, the voltage $V_{SL}(n)$ that is divided to the third selection line SL1 can be expressed by the below formula 1 by a product of a total sum of the current flowing into the third selection line SL1 and the parasitic resistance RL1.

$$V_{SL}(n) = n \cdot I_{SL} \cdot RL1 \quad (1)$$

Further, it is assumed that the absolute value of the voltage amplitude of the voltage pulse necessary for the forming of the one nonvolatile variable resistive element is $V_F$, and the absolute value of the voltage amplitude of the voltage pulse to be applied to the second selection lines BL1 to BL16 is $V_{BLF}$.

A situation in which the forming of all of the selected memory cells except for one memory cell has been completed will be considered. At this occasion, in order to perform the forming process on the one memory cell and complete the forming process of all of the selected memory cells, the below formula 2 needs to be satisfied.

$$V_{BLF} - V_{SL}(N-1) \geq V_F, \text{ that is, } V_{BLF} - (N-1)I_{SL} \cdot RL1 \geq V_F \qquad (2)$$

Here, N is a total number of memory cells that are the targets of the forming and commonly connected to the third selection line SL1, and in the present case, N=16. So long as the above formula 2 is satisfied, the forming process of the plurality of memory cells selected on the first selection line and the second selection lines is possible in a single step.

When the forming process of all of the memory cells selected on the first selection line and the second selection lines is completed (step #14), it is determined whether or not the second selection line selected in the above step #11 is the last second selection line (step #15). In a case where the selected second selection line is not the last second selection line, another yet unselected second selection line is newly selected (step #11), the absolute value $V_{BLF}$ of the voltage amplitude of the forming voltage pulse is set (step #12), and the forming voltage pulse is applied (step #13).

On the other hand, in a case where the second selection line selected in the above step #11 is the last second selection line, further, it is determined whether or not the first selection line selected in the above step #10 is the last first selection line (step #16). In a case where the selected first selection line is not the last first selection line, another yet unselected first selection line is newly selected (step #10), the second selection line is selected (step #11), the absolute value $V_{BLF}$ of the voltage amplitude of the forming voltage pulse is set (step #12), and the forming voltage pulse is applied (step #13).

Here, since all of the second selection lines in the memory cell array have been selected in step #11, step #15 is always determined YES, and in step #16, so long as the first selection line selected in step #10 is not determined as the last first selection line, another first selection line is selected, and further, all of the second selection lines BL1 to BL16 are selected, and for a plurality of memory cells connected to the newly selected first selection line, the processes of steps #12 to #14 are performed, and the forming process is simultaneously and collectively performed. By repeating this, the forming process can effectively be performed on all of the memory cells in the memory cell array whose addresses are designated by the first selection lines and the second selection lines.

As an example, in a memory cell formed of a selection element (MOS transistor) and a nonvolatile variable resistive element, a case in which the absolute value $V_F$ of the voltage amplitude of the necessary forming voltage pulse is 3V, the application time (forming time) of the forming voltage pulse is 100 μsec, the amount of current $I_{SL}$ flowing through the memory cell upon the completion of the forming is 50 μA, and the parasitic resistance RL1 is 1 kΩ, and the forming process is simultaneously performed for 16 nonvolatile variable resistive elements will be considered. According to the formula 2, by respectively applying 3.75 V or more as the absolute value $V_{BLF}$ of the forming voltage pulse to be applied to the second selection lines, all of the 16 nonvolatile variable resistive elements can collectively be subjected to the forming in a single step.

Here, by controlling the gate voltage of the transistor connected to the nonvolatile variable resistive element, the current $I_{SL}$ flowing through the memory cell after the completion of the forming is restricted by an amount of current in a saturation region of the transistor. Accordingly, by appropriately setting the bias condition of the transistor, the current $I_{SL}$ flowing through the memory cell after the completion of the forming can be restricted to be at or below a predetermined value, and the collective forming process becomes possible without breaking down the variable resistive elements. Further, the change in potential of the third selection lines can be suppressed to be within the certain range, and the absolute value $V_{BLF}$ of the voltage amplitude of the forming voltage pulse to be applied to the second selection lines can be maintained low.

Note that in the above embodiment, although the case in which the amount of current $I_{SL}$ flowing through the memory cell after the completion of the forming is restricted at 50 μA or lower has been explained, the present invention does not limit $I_{SL}$ to this value. However, by preferably lowering the current $I_{SL}$ to be at 50 μA or lower, the forming voltage can be subsequently applied to the memory cells where the forming process has not been completed without cutting off the current path on the selection line connected to the memory cell where the forming process is completed.

Second Embodiment

In the above first embodiment, a detailed description has been given of a case of adapting the method of the present invention to the memory cell array 501*a* in which the second selection lines and the third selection lines are orthogonally intersecting, however, the method of the present invention is not limited of its adaptation depending on the configuration of the memory cell array. Hereinbelow, a case of adapting the method of the present invention to a memory cell array 501*b* in which the second selection lines and the third selection lines are extending in parallel will be described in detail.

Figure 8:
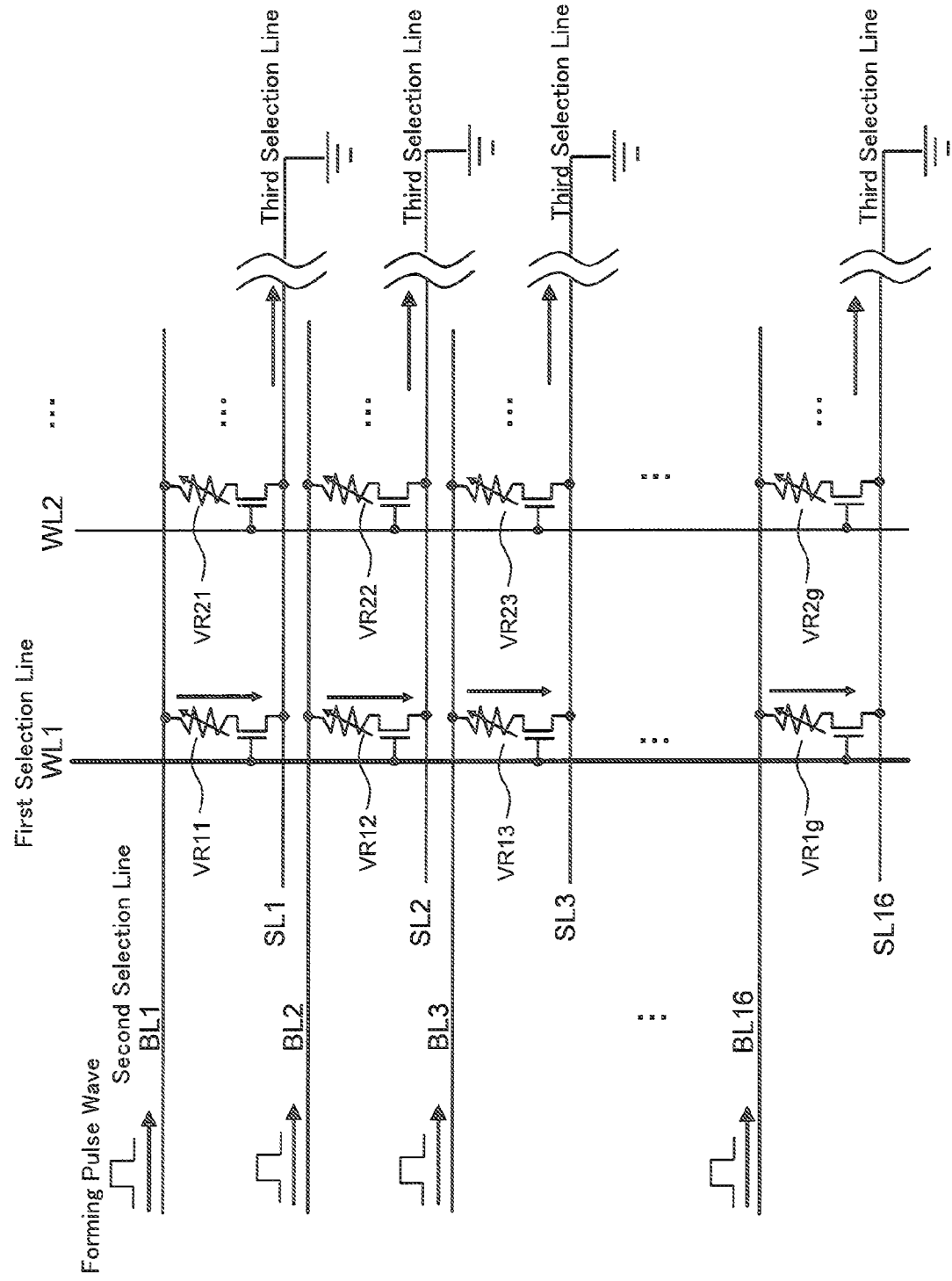
FIG. 8 is an equivalent circuit diagram of a memory cell array using the nonvolatile variable resistive elements to which the method of the second embodiment of the present invention is adapted.

The memory cell array 501*b* is shown in the equivalent circuit diagram in FIG. 8, and is a memory cell array in which a plurality of memory cells, each including a nonvolatile variable resistive element and a selection transistor, is aligned in the row and column directions in a matrix. Explanations on the configuration of the nonvolatile variable resistive element and the selection transistor will be omitted because these are identical to those of the first embodiment. The gate terminals of the selection transistors are connected to the first selection lines (word lines) extending in the row direction (the vertical direction in FIG. 8), and the memory cells belonging to the same row are mutually connected by the first selection line. One terminal of the nonvolatile variable resistive element not being connected to the selection transistor is connected to the second selection line (bit line) extending in the column direction (the lateral direction in FIG. 8), and the memory cells belonging to the same column are mutually connected by the second selection line. The source terminal of the selection transistor is connected to the third selection line (source line) extending in the column direction, and the memory cells belonging to the same column are mutually connected by the third selection line. By independently applying one of the first selection voltage and the first non-selection voltage via the first selection lines and one of the second selection voltage and the second non-selection voltage via the second selection lines, in the respective operations of the programming, erasure, read-out and forming processes, one memory cell that is the target of the operation designated by an address inputted from outside can be selected. Note that, in the present embodiment, the third selection line is grounded in the respective operations, however, a minuscule bias voltage that is slightly higher than the ground voltage may be applied.

Hereinbelow, an operation of a case of collectively performing the forming process to a plurality of memory cells by adapting the method of the present invention to device 1 of the present invention or the device 2 of the present invention installed with the above memory cell array 501b will be explained with reference to FIG. 7 and FIG. 8.

First, similar to the first embodiment, the first selection lines (word lines) are selected (step #10). Here, the first selection lines WL1 and WL2 are selected. The voltage generating circuit 504 generates the first selection voltage and the first non-selection voltage, and the first selection line decoder 506 respectively applies the first selection voltage to the gate terminals of the selection transistors of the memory cells connected to the selected first selection lines, and the first non-selection voltage to the gate terminals of the selection transistors of the memory cells connected to the unselected first selection lines. Due to this, current can be caused to flow only in the nonvolatile variable resistive elements of the memory cells connected to the selected first selection lines.

Next, similar to the first embodiment, a plurality of second selection lines (bit lines) are selected (step #11). Here, all of the second selection lines BL1 to BL16 in the memory cell array are selected.

When the first selection lines and the second selection lines are respectively selected, for each of the selected second selection lines, the maximum number of memory cells that are the targets of the forming and commonly connected to the third selection line to which the respective selected memory cells on the selected second selection line are connected is calculated based on the positions and the numbers of the selected first selection lines and second selection lines, and an absolute value $V_{BLF}$ of the voltage amplitude of the forming voltage pulse to be applied is set such that a formula 4 described later is satisfied (step #12). In the memory cell array 501b of the present embodiment, since the second selection lines and the third selection lines extend in parallel, the maximum number of the memory cells commonly connected to the third selection lines for each of the selected second selection lines is equal to the total number of the selected first selection lines. Here, since the first selection lines WL1 to WL2 are selected, the maximum number of the memory cells is 2.

The voltage generating circuit 504 generates the voltage pulse for the forming process with the voltage amplitude calculated in the above step #12, and the second selection line decoder 508 simultaneously applies the voltage pulse for the forming process via all of the selected second selection lines, and causes the current to flow from the selected second selection lines to the third selection lines (source lines) (step #13). Due to this, the forming process is simultaneously performed on the plurality of memory cells VR11 to VR1g and VR21 to VR2g that is selected by the first selection lines WL1 and WL2 and the second selection lines BL1 to BL16.

When the forming process is completed in one of the memory cells among the selected memory cells VR11 to VR1g, VR21 to VR2g, the resistance of the nonvolatile variable resistive element in this memory cell is decreased, whereby the amount of current flowing into the second selection line to which this memory cell connects is increased, and the current with the aforesaid amount of current added thereto flows into one of the third selection lines SL1 to SL16 corresponding to the second selection line. As a result, a part of the voltage $V_{BLF}$ that is supposed to be applied to the nonvolatile variable resistive element is divided to the parasitic resistance from the load circuit (decoder) on the voltage pulse applying path to the connecting point of the second selection line and the memory cell and the parasitic resistance from the connecting point of the third selection line and the memory cell to the ground potential, and the absolute value of the substantial voltage pulse that is applied to the nonvolatile variable resistive element is lowered.

Here, assuming that the current that flows into the third selection line SL1 upon the completion of the forming of one memory cell is $I_{SL}$, and the maximum value of the parasitic resistance from the connecting point of the third selection line and the memory cell to the ground potential is RL1, at the time when the forming process of n memory cells among N selected memory cells commonly connected to the third selection line SL1 is completed, the voltage $V_{SL}(n)$ that is divided to the third selection line SL1 can be expressed by the above formula 1, similar to the first embodiment.

Further, in assuming that the maximum value of the parasitic resistance from the load circuit (decoder) on the voltage pulse applying path to the connecting point of the second selection line and the memory cell is RL2, in the case of performing the forming process by selecting a plurality of first selection lines, at the time when the forming of m memory cells among the plurality of memory cells that are the targets of the forming, connected to the same second selection line and connected to different first selection lines is completed, the voltage $V_{BL}(m)$ that is divided to the second selection line can be expressed by the below formula 3.

$$V_{BL}(m)=m \cdot I_{SL} \cdot RL2 \tag{3}$$

In such a case, the situation in which the forming of all of the selected memory cells except for one memory cell has been completed will be considered. In order to perform the forming process of the one memory cell, and complete the forming process of all of the selected memory cells, simply the below formula 4 needs to be satisfied.

$$V_{BLF}-V_{SL}(N-1)-V_{BL}(M-1) \geqq V_F \tag{4}$$

Here, M is a total number of the selected first selection lines. Although N is the maximum number of the memory cells that are the targets of the forming and commonly connected to the third selection line SL1, in the present embodiment, it is equal to the number of the selected first selection lines, thus is N=M (=2). Accordingly, the above formula 4 can be simplified as $V_{BLF}-(N-1)I_{SL} \cdot (RL1+RL2) \geqq V_F$. So long as the above formula 4 is satisfied, the forming process of the plurality of memory cells selected on the plurality of first selection lines and the second selection lines is possible in a single step.

As mentioned above, in the present embodiment, since the method of the present invention is adapted to the memory cell array 501b, the amount of increase (decrease) in the potential of the third selection lines caused by current flowing into the third selection lines is dependent on the number of the selected first selection lines, and not dependent on the number of the selected second selection lines. Accordingly, by selecting all of the second selection lines in the memory cell array and selecting all of the memory cells belonging to the same row, the forming process can be performed for each of the rows.

As an example, a case of simultaneously forming a memory block formed by 512 memory cells in the row direction and 16 memory cells in the column direction, a total of 8096 memory cells, the case in which the absolute value $V_F$ of the voltage amplitude of the necessary forming voltage pulse is 3V, the application time (forming time) of the forming voltage pulse is 100 μsec, the amount of current $I_{SL}$ flowing through the memory cell upon the completion of the forming is 50 μA, and the parasitic resistance RL1 from the third selection line to the ground potential and the parasitic resistance RL2 from the load circuit (decoder) to the second selection line are 1 kΩ each will be considered. The 16 first selection lines (word lines) and all of the 512 second selection lines (bit lines) are selected, and the forming voltage pulse is applied via the second selection lines. According to the formula 4, by respectively applying 4.5 V or more as the absolute value $V_{BLF}$ of the forming voltage pulse to be applied to the second selection lines, all of the 8096 nonvolatile variable resistive elements can collectively be subjected to the forming in a single step.

Here, similar to the first embodiment, since the current $I_{SL}$ flowing through the memory cells after the completion of the forming is restricted by the amount of current in the saturation regions of the transistors, the collective forming process becomes possible without breaking down the variable resistive elements, the change in potential of the third selection lines can be suppressed to be within the certain range, and the absolute value $V_{BLF}$ of the voltage amplitude of the forming voltage pulse to be applied to the second selection lines can be maintained low.

Accordingly, by the method of the present invention, the forming process can be performed by simultaneously applying the voltage pulse to the plurality of memory cells that is selected by one or more first selection lines (word lines) and the plurality of second selection lines (bit lines), thereby the forming time can be shortened.

Third Embodiment

Figure 9:
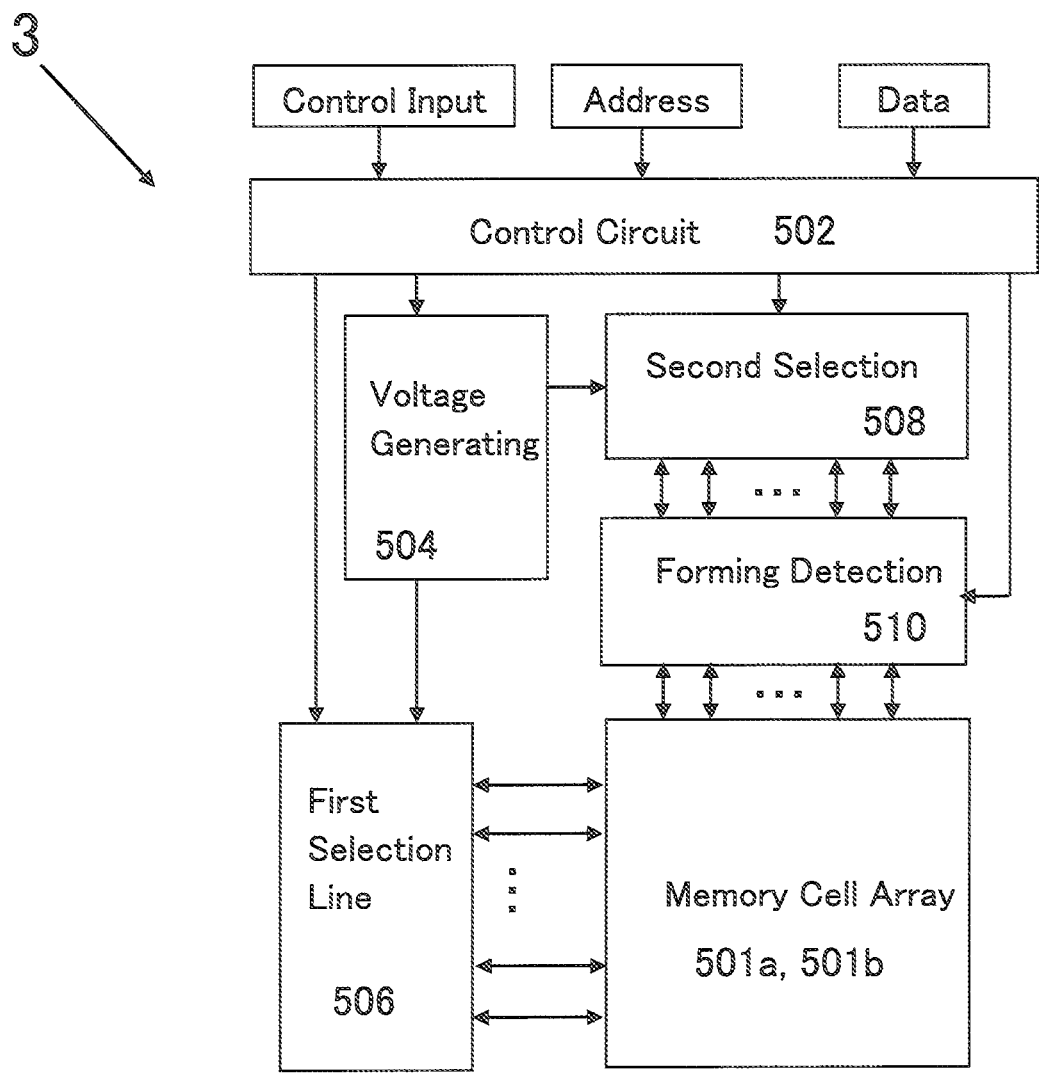
FIG. 9 is a structural block diagram of a nonvolatile semiconductor memory device that can use the method of a third embodiment of the present invention.

The method of the present invention is further effective by adapting the same to a nonvolatile semiconductor memory device provided with a forming detection circuit that detects the change in potential of the second selection lines or the third selection lines that accompanies the completion of the forming. FIG. 9 is a structural circuit diagram of the nonvolatile semiconductor memory device (hereinbelow referred to as "the device 3 of the present invention") that is the object of the adaptation of the method of the present invention. As shown in FIG. 9, the device 3 of the present invention has a configuration in which a forming detection circuit 510 is further provided between the second selection lines and the second selection line decoder 508 of the device 1 of the present invention provided with the memory cell array 501a or 501b (501a in the present embodiment).

The forming detection circuit 510 is, for example, arranged between the second selection lines and the second selection line decoder 508, and during the forming process, detects the change in the amount of current flowing in the respective second selection lines or the potential of the second selection lines that accompany the decrease in the resistance of the nonvolatile variable resistive elements of the memory cells by the completion of the forming process. When the change in the current or the potential is detected, it can be determined that the forming process has been completed at least in one memory cell connected to the second selection line in which the change in the current or the potential has been detected. Further, when the change in potential of the second selection line is detected, the forming detection circuit 510 has, in a case where it can be determined that the forming process has been completed in all of the memory cells connected to the second selection line in which the change in potential has been detected, a function of cutting off the current path between the voltage generating circuit and the memory cell array on the second selection line connected to the memory cells where the forming process has been completed.

Figure 10:
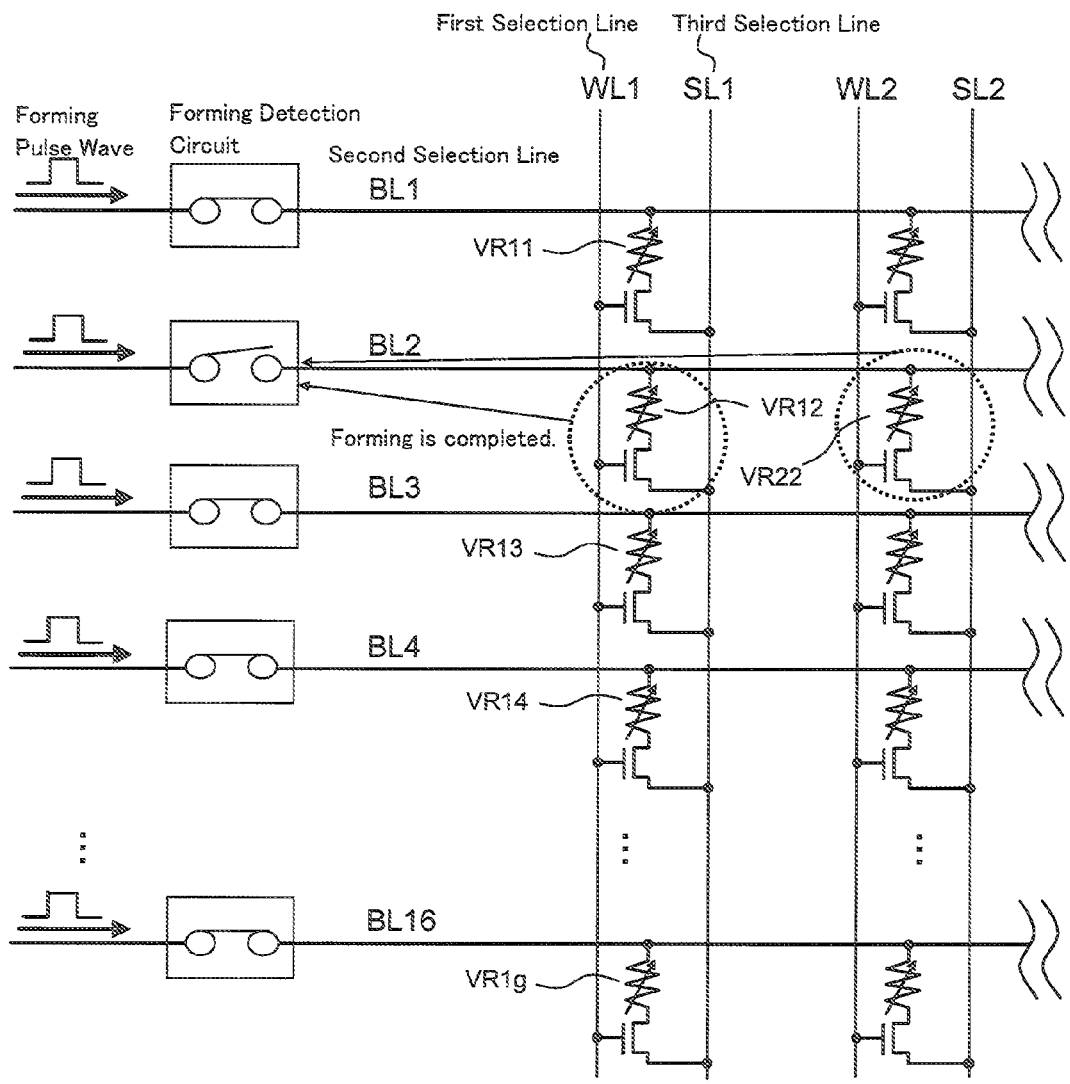
FIG. 10 shows an equivalent circuit diagram of a memory cell array to which a forming detection circuit to which the method of the third embodiment of the present invention is adapted is incorporated, and an operation of the forming process of the method of the third embodiment of the present invention.

FIG. 10 is an example in which the forming detection circuit is attached to each of the second selection lines of the memory cell array shown in FIG. 3. In FIG. 10, the selection transistors are caused to be in an on-state by applying the first selection voltage to the first selection lines WL1 and WL2, and by simultaneously applying the voltage pulse for the forming process with positive polarity to each of the second selection lines BL1 to BL16, the memory cells connected to the first selection lines WL1 and WL2 are attempted for a simultaneous and collective forming.

Here, if it is assumed that the forming process of the two memory cells VR12, VR22 connected to the second selection line BL2 is completed earlier than the two memory cells respectively connected to the other second selection lines BL1, BL3 to BL16, the nonvolatile variable resistive elements of the two memory cells where the forming process has been completed change from the insulated state to the low resistive state at or less than 1MΩ, thus the current flowing through the second selection line BL2 increases. If the current that flows in a memory cell upon the completion of the forming is $I_{SL}$, $2I_{SL}$ flows through the second selection line BL2. As a result, due to the influence of the parasitic resistance on the third selection line side, the potential of the third selection lines SL1, SL2 is increased, and the potential of the second selection line BL2 connected to the memory cells where the forming process has been completed decreases due to the influence of the parasitic resistance, etc. of the second selection line decoder, etc.

When a decrease in the potential of the second selection line BL2 that exceeds the predetermined value is detected, the forming detection circuit 510 electrically cuts off the second selection line BL2 and the memory cells. By so doing, the increase in the potential of the third selection lines SL1 and SL2 is decreased.

Figure 11:
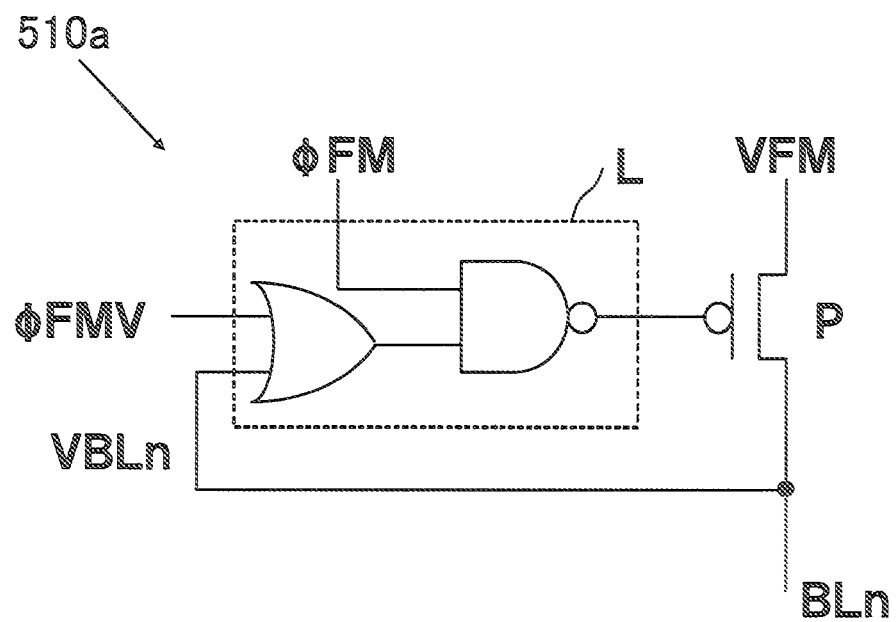
FIG. 11 is a diagram showing a structural example of the forming detection circuit of the present invention.

An example of the circuit configuration of the forming detection circuit is shown in FIG. 11. In the forming detection circuit 510a shown by the equivalent circuit diagram of FIG. 11, a logic circuit L and p-type MOS transistor P are arranged and connected on the respective second selection lines BLn between the memory cell array 501a and the second selection line decoder 508. On the application path of the voltage pulse VFM for the forming process to the second selection lines BLn, a transistor P is inserted. The gate terminal of the transistor P is connected to an output of the circuit L, and the current flowing between the source-drain of the transistor P is controlled by three input signals of a forming start signal ϕFM, a potential change check start signal ϕFMV, and a second selection voltage signal VBLn.

Figure 12:
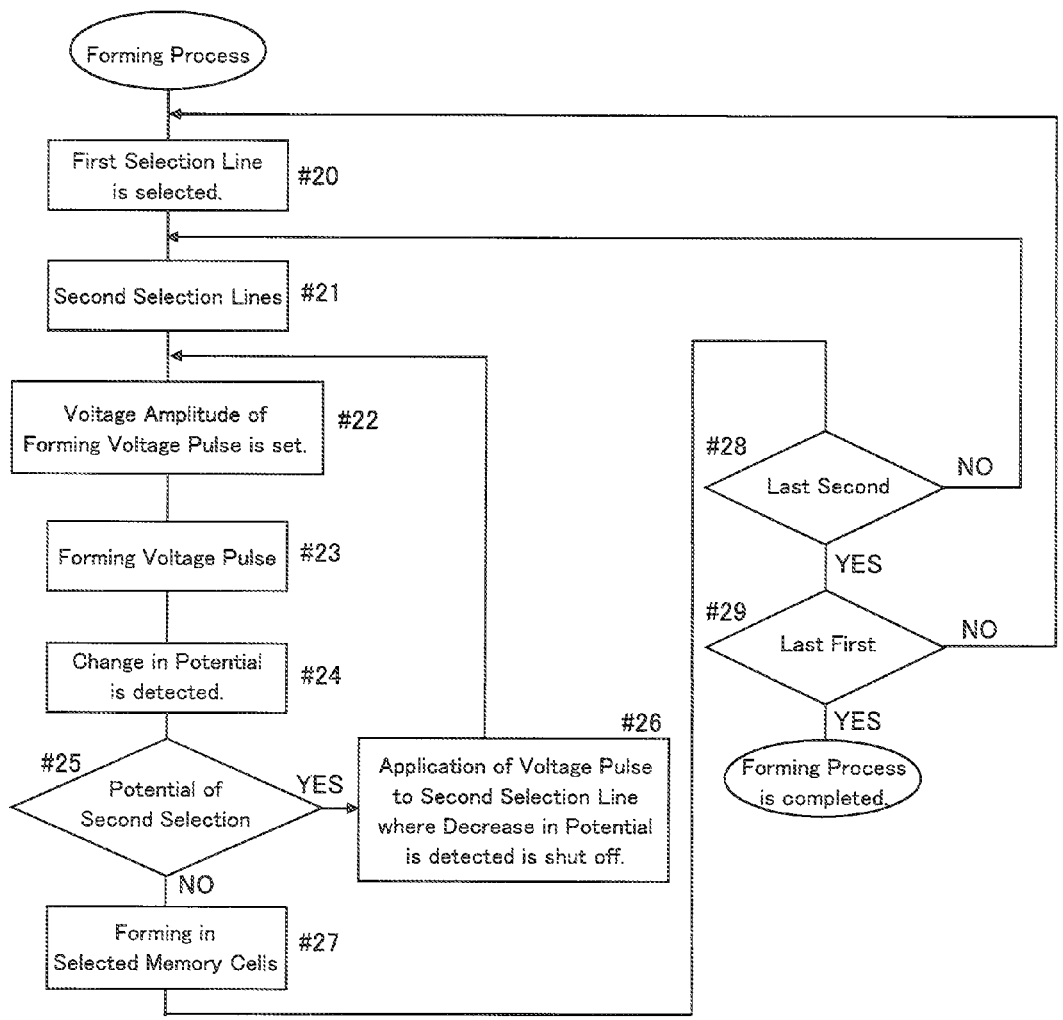
FIG. 12 shows a flowchart of a control of the forming process of the third embodiment of the present invention.

Hereinbelow, the operation of the forming detection circuit 510a will be explained with reference to a flowchart of FIG. 12. FIG. 12 shows a flowchart of a control for a case of collectively performing the forming process on a plurality of memory cells according to the method of the present invention, in order to perform the forming process on all of the memory cells in the memory cell array. Before the start of the forming process, the transistors P are in an off-state because ϕFM is in the off-state (low level), and the second selection lines BLn are in the electrically cut off state by the transistors P. Due to this, VBLn is in the off-state (floating).

Similar to the first and second embodiments, one or more first selection lines (word lines) are selected in step #20, a plurality of second selection lines (bit lines) are selected in step #21, and the absolute value $V_{BLF}$ of the voltage amplitude of the forming voltage pulse is set such that the above formula 4 is satisfied in step #22. At this occasion, ϕFM and ϕFMV are simultaneously shifted to the on-state, and the transistors P are shifted to the on-state. Due to this, in step #23, the forming voltage pulse generated by the voltage generating circuit 504 is applied to each of the selected second selection lines via the second selection line decoder 508.

Next, in step #24, φFMV is shifted to the off-state (low level) so as to detect the change in potential on the second selection lines BLn. In the case where no memory cell where the forming process has been completed exists, the decrease in the potential of the second selection lines BLn does not occur and VBLn maintains a high level, thus the transistors P maintain the on-state.

On the other hand, in the case where a memory cell where the forming process has been completed exists in the plurality of memory cells connected to the second selection lines BLn, current that is at least equal to or larger than the current $I_{SL}$ flows through the second selection lines BLn to the third selection lines. As a result, in the case where the voltage pulse with positive polarity is applied to the second selection lines BLn, due to the influence of the load circuits existing in the voltage pulse applying path, such as the second selection line decoder 508, etc., the potential of the second selection lines BLn connected to the memory cell where the forming process has been completed decreases. Further, in the case where a plurality of first selection lines are selected, when the forming process of all of the selected memory cells connected to the same second selection line BLn and different first selection lines is completed, current of which total amount is $M \cdot I_{SL}$ flows through the second selection line, and thus a decrease in the potential of the second selection line BLn corresponding to this amount of current occurs. Here, M is the number of selected first selection lines.

in step #25, when the potential of the second selection line BLn decreases to or below a predetermined potential corresponding to the amount of current of $M \cdot I_{SL}$, the forming detection circuit 510*a* is set such that VBLn shifts to the off-state (low level), and as a result, voltage is applied to the gate terminal of the transistor P, the transistor P shifts to the off-state, and the second selection line BLn is electrically cut off. According to this, the application of the voltage pulse VFM for the forming process to the second selection line connected to the memory cell where the forming has been completed is shut off in step #26.

As a result, since the current stops to flow in the memory cells connected to the second selection line BLn where the forming process has been completed, the increase in the potential of the third selection lines is suppressed. According to this, as for the remainder of the memory cells where the forming process has not yet been completed, the voltage amplitude $V_{BLF}$ of the voltage pulse can be lowered, and the collective forming process can be continued.

When the application of the forming voltage pulse to one of the selected second selection lines is shut off by the operation of the forming detection circuit 510*a*, the control circuit 502 unselects the second selection line in which the voltage application has been shut off, and resets the absolute value $V_{BLF}$ of the voltage amplitude of the forming voltage pulse such that the above formula 4 is satisfied. That is, by returning to step #22, $V_{BLF}$ is recalculated with the number of the selected second selection lines having been decreased by one. In the present embodiment provided with the memory cell array 501*a*, with $V_{BLF}$ being dependent on the number of the second selection lines, a value in which $I_{SL} \cdot RL1$ is subtracted is reset as new $V_{BLF}$ based on the above formula 4, and the forming voltage pulse generated by the voltage generating circuit 504 is applied via the second selection line decoder 508 to each of the second selection lines connected to the memory cells where the forming process has not yet been completed.

The method of the present invention as above is especially useful in the case of simultaneously performing the forming process to all of the memory cells selected by selecting the plurality of first selection lines and the plurality of second selection lines, and the application of unnecessary forming voltage pulse can be suppressed.

Note that, in the present embodiment, upon the respective memory operations of the programming, erasure and read-out processes, the forming detection circuit 510*a* may be bypassed, or, voltages for the respective memory operations may be applied with φFM and φFMV being in the on-state.

By controlling the forming process by the method of the present invention as disclosed in the above first to third embodiments, the time required for the forming process of the nonvolatile variable resistive elements of all of the memory cells connected to the one or more selected first selection lines and the plurality of second selection lines can be shortened to the maximum required time of a case of performing the forming process on a nonvolatile variable resistive element of one memory cell.

Other Embodiments

Hereinbelow, other embodiments of the present invention will be described.

(1) In the above embodiments, in the forming process of the memory cells, although a detailed description has been made of a method for simultaneously and collectively performing the forming process on the plurality of selected memory cells by selecting the one or more first selection lines and the plurality of second selection lines, the object of the adaptation of the method of the present invention is not limited to the above forming process. It may similarly be applicable to a collective programming operation or a collective erasure operation of the memory cells.

A case in which one or more first selection lines and a plurality of second selection lines are selected, and the programming operation or the erasure operation is simultaneously and collectively performed on the selected plurality of memory cells will be considered. Since a large current flows through memory cells in a low resistive state, the amount of current flowing through the second selection line is increased in accordance with the number of memory cells connected to the second selection lines and the number of memory cells in the low resistive state, and the current increased by the amount of current flows into the third selection lines. As a result, in the case where the voltage pulse with positive (negative) polarity is applied to the selected second selection line, the potential of the third selection lines increases (decreases) due to the influence of the parasitic resistance, etc. in the third selection lines. At the same time, due to the influence of the load circuits such as the transistors existing in the voltage pulse applying path, such as the second selection line decoder 508, etc., the potential of the second selection line connected to the memory cell where the forming process has been completed decreases (increases). As a result, the absolute value of the substantial voltage pulse applied to the nonvolatile variable resistive elements is decreased.

Here, current that flows through memory cells in the low resistive state when the voltage pulse is applied via the second selection lines and a voltage pulse for erasure (programming) is applied to one memory cell is assumed as $I_W$, and the parasitic resistance from the third selection lines to the ground potential is assumed as RL1. The parasitic resistance from the load circuit (decoder) to the second selection lines is assumed as RL2. Further, the maximum number of memory cells that are the targets of the writing and commonly connected to the third selection lines to which the respective selected memory cells, which connect to the second selection lines, are connected is assumed as N. The number of selected first selection lines is assumed as M. As mentioned above, in the case of the configuration in which the second selection lines and the third selection lines intersect orthogonally, N is equal to the number of selected second selection lines; and in the case of the configuration in which the second selection lines and the third selection lines extend in parallel, N is equal to the number of selected first selection lines. Here, the voltage $V_{BL}(M)$ that is divided to the second selection lines and the voltage $V_{SL}(N)$ that is divided to the third selection lines can, in the worst case, be expressed by the below formula 5 which is a product of a total sum of the current flowing into the third selection line SL1 and the parasitic resistance.

$$V_{SL}(N)=N \cdot I_W \cdot RL1, \ V_{BL}(M)=M \cdot I_W \cdot RL2 \tag{5}$$

Further, in assuming that the absolute value of the voltage amplitude of the voltage pulse necessary for the erasure (programming) of the nonvolatile variable resistive elements is $V_W$, and the absolute value of the voltage amplitude of the voltage pulse that should be applied to the second selection lines is $V_{BLW}$, the programming operation of all of the selected memory cells can collectively be performed so long as the below formula 6 is satisfied.

$$V_{BLW}-V_{SL}(N)-V_{BL}(M) \geqq V_W \tag{6}$$

As an example, in the memory cell 501a formed by the selection element (MOS transistor) and the nonvolatile variable resistive element, a case in which 16-bits nonvolatile variable resistive elements are to be simultaneously subjected to the programming or erasure process with the absolute value $V_W$ of the voltage amplitude of the necessary writing voltage pulse being 2V, the resistance value $R_1$ (~$V_W/I_W$) of the low resistive state of the nonvolatile variable resistive elements being 0.1 MΩ, and the parasitic resistances RL1, RL2 being 1 kΩ will be considered. According to the formula 6, by respectively applying 2.34 V or more as the absolute value $V_{BLW}$ of the programming voltage pulse or the erasure voltage pulse to be applied to the second selection lines, all of the 16-bit nonvolatile variable resistive elements can simultaneously and collectively be written.

(2) In the above third embodiment, although a configuration of detecting the change in the potential of the second selection lines is shown as an example of the specific configuration of the forming detection circuit 510 that detects the completion of the forming process in the memory cells connected to the respective second selection lines, it may detect the increase in the amount of current flowing through the second selection lines. Further, as an example of the specific configuration of the forming detection circuit 510, although the circuit in which the logic circuit L and p-channel MOS transistor P are combined is shown in FIG. 11 as the example, the present invention is not limited to this circuit configuration.

(3) In the above third embodiment, the forming detection circuit 510 has the function of cutting off the current path on the second selection line connected to the memory cell where the completion of the forming process has been detected, and controls so that the voltage pulse for the forming process is not applied to the nonvolatile variable resistive element of the memory cell where the forming process has been completed, however, the present invention is not limited to this configuration. For example, when the change in the potential of the second selection line connected to the memory cell that is the target of the forming process is detected, the forming detection circuit 510 may send a forming completion signal to the second selection line decoder 508 directly or via the control circuit 502, and the second selection line decoder 508 may, in response to receiving the aforementioned signal, perform a control to unselect the second selection line connected to the memory cell where the forming process has been completed, and thereby the same effect can be obtained.

(4) In the above third embodiment, an example in which the method of the present invention is adapted to the device 1 of the present invention provided with the forming detection circuit 510 between the second selection lines and the second selection line decoder 508 has been explained, however, by providing the forming detection circuit 510 between the second selection lines and the second selection line decoder 508, or between the third selection lines and the third selection line decoder 509, the method of the present invention may alternatively be adapted to the device 2 of the present invention having the third selection line decoder, and the forming process can simultaneously be performed on the plurality of memory cells thereby.

Figure 13:
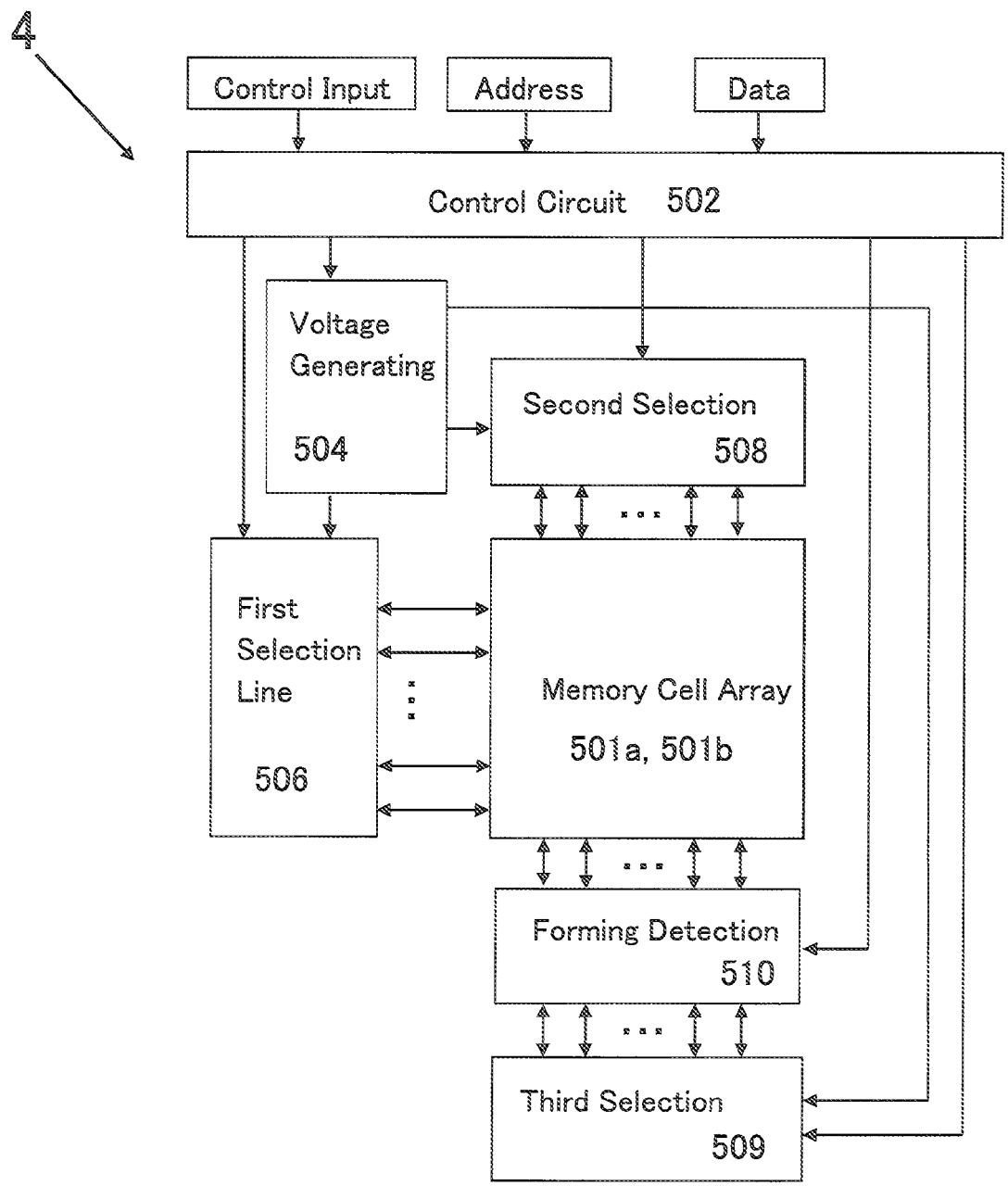
FIG. 13 is a structural block diagram of a nonvolatile semiconductor memory device that can use the method of another embodiment of the present invention.

A nonvolatile semiconductor device shown in FIG. 13 (the device 4 of the present invention) has a configuration in which the forming detection circuit 510 is provided between the third selection lines and the third selection line decoder 509 of the device 2 of the present invention further provided with the third selection line decoder. By applying the forming voltage pulse via a plurality of selected third selection lines, the forming process can simultaneously be performed on a plurality of memory cells selected by one or more first selection lines and the plurality of third selection lines.

In this configuration, the forming detection circuit 510 is, for example, arranged between the memory cell array and the third selection line decoder 509, and during the forming process, detects the amount of current flowing into the respective third selection lines or the change in potential of the third selection lines that accompanies the decrease in the resistance of the nonvolatile variable resistive elements of the memory cells by the completion of the forming process. This configuration is an equivalent of the aforementioned third embodiment in which the role of the second selection lines therein is substituted by the third selection lines and the role of the third selection lines therein is substituted by the second selection lines, and since the method of the present invention as explained in the third embodiment can be used as it is, the detailed explanation will be omitted.

(5) In the third embodiment and the other embodiment above, the forming detection circuit 510 is arranged on the same selection line side as where the forming voltage pulse is to be applied. However, a configuration in which the forming detection circuit 510 is arranged on the opposite side from where the forming voltage pulse is to be applied may be implemented. For example, a configuration in which the forming voltage pulse is applied from the second selection lines, and the change in current flowing into the third selection lines or potential of the third selection lines is detected by the forming detection circuit arranged on the third selection line side may be implemented. In such a case, however, detection of the change in current flowing through the second selection lines to which the voltage pulse is applied or potential thereof from the change in current flowing through the third selection lines or potential thereof can only be accomplished in a case where the second selection lines and the third selection lines extend in parallel, and the second selection lines and the third selection lines are corresponding to each other in a one-by-one manner. In this configuration, in a case where the forming detection circuit 510 detects the change in potential of the third selection lines, and can determine that the forming process of all of the memory cells connected to the third selection lines on which the change in potential has been detected has been completed, the forming detection circuit 510 sends the forming completion signal to the second selection line decoder 508 directly or via the control circuit 502, performs a control to unselect the second selection lines connected to the memory cells where the forming process has been completed, and stops the application of the forming voltage pulse via the aforementioned second selection lines.

Due to this, the forming process can be performed effectively such that the one or more first selection lines (word lines) and the plurality of second selection lines (bit lines) are selected, respectively, the voltage pulse for the forming process is simultaneously applied via all of the selected second selection lines to cause the current to flow from the selected second selection lines to the third selection lines (source lines), the forming detection circuit detects the change in potential of the third selection lines connected to the memory cells where the forming process has been completed, and the voltage application via the second selection lines to the memory cells where the forming process has been completed is stopped.

Figure 14:
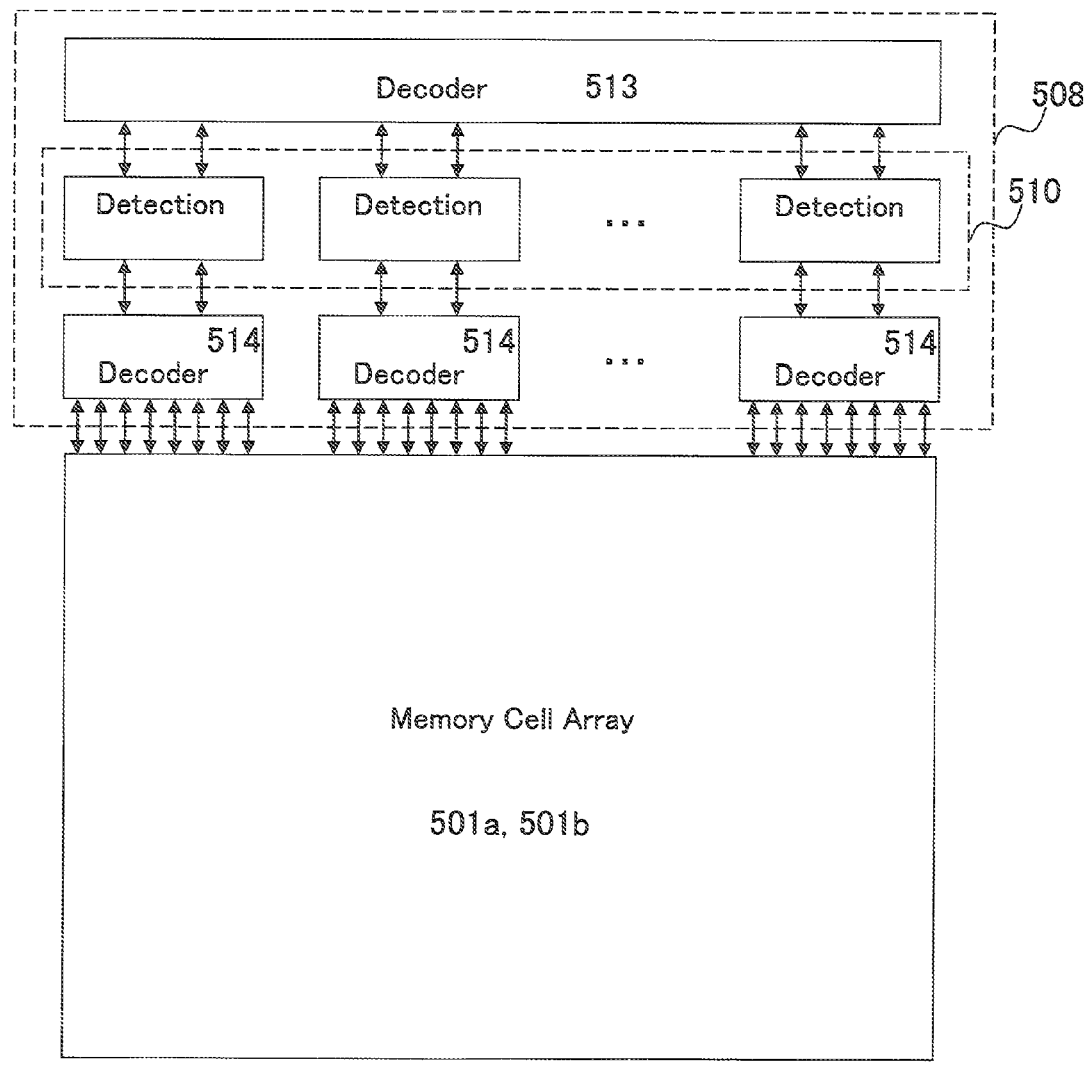
FIG. 14 is a structural block diagram of a second selection line decoder installing a forming detection circuit of another embodiment of the present invention.

(6) In the above embodiments, the configuration in which the circuit composed of the circuit L and p-type MOS transistor as shown in FIG. 11 is connected to the second selection lines between the memory cell array and the second selection line decoder 508 or to the third selection lines between the memory cell array and the third selection line decoder 509, respectively, however, as shown in FIG. 14, this circuit may be arranged in the second selection line decoder 508 or in the third selection line decoder 509. FIG. 14 is another embodiment of the forming detection circuit, in which the plurality of detection circuits 511 composed of the circuit L and the p-type MOS transistor as shown in FIG. 11 is installed, for example, in the second selection line decoder 508, and is inserted between a decoder 513 in the front stage and decoders 514 in the rear stage. The outputs of the detection circuits 511 are inputted to the decoders 514 in the rear stage, and upon performing a forming process on a memory cell, the decoders 514 in the rear stage can select the second selection line to be connected to the memory cell that is the target of the forming process from among a plurality of second selection lines (for example, among eight of them) through a switching signal.

The decoder 513 in the front stage selects the decoder 514 in the rear stage, to which the second selection line that is connected to the memory cells for a forming process is connected when an address input designates the memory cells for the forming process, and then applies a voltage pulse for a forming process to be applied to the selected second selection line to the decoder 514 in the rear stage through the detection circuit 511, and at the same time sends the switching signal to the decoder 514 in the rear stage. The decoder 514 in the rear stage selects one second selection line from among a plurality of second selection lines that are connected to the decoder 514 on the basis of the switching signal, and applies a voltage pulse for a forming process to the selected second selection line.

During the forming process, the detection circuit 511 disconnects the current path from the decoder 513 in the front stage to the decoder 514 in the rear stage when detecting fluctuation in the potential of the second selection line accompanying a forming process which is carried out on the selected memory cells, and as a result temporarily stops the voltage pulse for the forming process that is applied to the decoder 514 in the rear stage. After that, the detection circuit 511 sends a switching signal to the decoder 514 in the rear stage to select the next second selection line that is connected to the decoder 514 in the rear stage and memory cells where the forming process has not been completed yet, so that the application of the voltage pulse for a forming process is switched to the newly selected second selection line. This is repeated until the forming process is completed for all of the memory cells that are connected to the second selection lines that are connected to the decoder in the rear stage, so that the forming process can be efficiently carried out on all of the memory cells that are connected to the same first selection line.

Thus, even in cases where the memory cells are made smaller in size, and it is not realistic to provide forming detection circuits as those shown in FIG. 11 for all of the second selection lines, the structure allows the second selection line for forming detection to be selected from among a plurality of second selection lines via the decoder in the rear stage. As a result, a forming detection circuit can be connected every certain number of second selection lines, and therefore, the forming process for memory cells can be carried out efficiently while keeping the area occupied by the forming detection circuit small.

The present invention can be used in the resistance control of the nonvolatile variable resistive elements, especially, it can be used in the control of the forming process of the nonvolatile semiconductor memory device provided with the nonvolatile variable resistive elements.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method of controlling a resistance of a nonvolatile variable resistive element, wherein
in a nonvolatile semiconductor memory device including a memory cell array in which a plurality of memory cells is arranged in row and column directions in a matrix, each memory cell being formed by connecting one terminal of the nonvolatile variable resistive element having two terminals in which electrodes are provided at both ends of a variable resistor, to one of other two terminals of a selection element, which has three terminals including a control terminal and the other two terminals that are other than the control terminal, the control terminal being for controlling an amount of current flowing across the other two terminals by current or voltage applied to the control terminal,
the nonvolatile variable resistive element is subjected to a forming process, so that its resistive state transitions between two or more different resistive states by applying an electrical stress across the both terminals of the nonvolatile variable resistive element, and one resistive state after the transition is used for storing information,
the each memory cell is configured such that
the control terminal of the selection element is connected to a first selection line, and
one of a terminal of the nonvolatile variable resistive element that is not connected to the selection element and a terminal of the selection element that is other than the control terminal and not connected to the nonvolatile variable resistive element is connected to a second selection line and the other thereof is connected to a third selection line,
the first selection line extends in the row direction and connects the memory cells belonging to the same row,
the second selection line extends in the column direction and connects the memory cells belonging to the same column, and the memory cells in the memory array are mutually connected by the first selection line, the second selection line and the third selection line, and the method comprises:

when one or more first selection lines and a plurality of second selection lines are to be selected, respectively and one of memory operations of a programming process, an erasure process, and the forming process is to be collectively performed on target memory cells that are all of the memory cells selected by the first selection lines and the second selection lines, a first step of selecting the one or more of the first selection lines connected to the target memory cells to be subjected to the memory operation in the memory array and applying a predetermined selection voltage to all of the selected first selection lines;

a second step of selecting the plurality of second selection lines connected to the target memory cells in the memory array; and a third step of applying, to each of the selected second selection lines, a compensated voltage in which a change in potential of the third selection lines caused by current flowing into the third selection lines through the second selection lines is compensated in a voltage that is necessary for the memory operation of the nonvolatile variable resistive elements, the change in potential being dependent on a maximum number of the target memory cells that are commonly connected to each of the third selection lines to which the respective target memory cells on the selected second selection line are connected, such that the voltage that is necessary for the memory operation is applied to both terminals of all of the target memory cells.

2. The method of controlling a resistance of a nonvolatile variable resistive element according to claim 1, wherein in the memory cell array, each of the third selection lines extends in the column direction, and the memory cells belonging to the same column are mutually connected by each of the third selection lines.

3. The method of controlling a resistance of a nonvolatile variable resistive element according to claim 1, wherein the memory operation is the forming process.

4. The method of controlling a resistance of a nonvolatile variable resistive element according to claim 3, wherein in the forming process, a bias condition for the selection elements in the memory cells is set such that the amount of current that flows in the nonvolatile variable resistive elements is equal to or lower than 50 μA.

5. The method of controlling a resistance of a nonvolatile variable resistive element according to claim 3, wherein the nonvolatile semiconductor memory device is formed by connecting a forming detection circuit to the second selection line directly or via a decoder, or to the third selection line directly or via a decoder in a case where the third selection lines extend in the column direction, the forming detection circuit being for detecting, upon completion of the forming process, a change in current flowing through predetermined position in the second selection line or a change in potential at the predetermined position of the second selection line, the method further comprising a fourth step in which, when the forming detection circuit detects the change in current or potential in a particular second selection line, the nonvolatile semiconductor memory device stops application of the voltage through the particular second selection line in a case where the forming process of all of the memory cells connected to the particular second selection line is completed.

6. The method of controlling a resistance of a nonvolatile variable resistive element according to claim 5, further comprising, when the nonvolatile semiconductor memory device stops the application of the voltage through the particular second selection line in the fourth step, a fifth step of setting the particular second selection line as unselected, recalculating the maximum number of the target memory cells to be subjected to the forming process that are commonly connected to each of the third selection lines to which the respective target memory cells on the respective selected second selection lines are connected, and applying, to each of the selected second selection lines, a compensated voltage in which a change in potential of the third selection lines caused by current flowing into the third selection lines through the second selection lines is compensated in a voltage that is necessary for the forming process of the nonvolatile variable resistive elements.

* * * * *